United States Patent
Ning et al.

(10) Patent No.: US 12,478,280 B2
(45) Date of Patent: Nov. 25, 2025

(54) IMPEDANCE TUNER, MAGNETIC RESONANCE SYSTEM, TRANSMISSION APPARATUS, AND TRANSMISSION METHOD

(71) Applicant: GE Precision Healthcare LLC, Wauwatosa, WI (US)

(72) Inventors: Jianye Ning, Beijing (CN); Xin Xie, Beijing (CN); Yu Liu, Beijing (CN); Chunlai Xiao, Beijing (CN); Sheng Tong, Beijing (CN); Dongliang Yang, Beijing (CN); Kai Wang, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 350 days.

(21) Appl. No.: 18/194,862

(22) Filed: Apr. 3, 2023

(65) Prior Publication Data

US 2023/0337933 A1    Oct. 26, 2023

(30) Foreign Application Priority Data

Apr. 26, 2022 (CN) .......................... 202210443790.5

(51) Int. Cl.
*A61B 5/053* (2021.01)
*A61B 5/055* (2006.01)

(52) U.S. Cl.
CPC .............. *A61B 5/055* (2013.01); *A61B 5/053* (2013.01)

(58) Field of Classification Search
CPC ........ A61B 5/055; A61B 5/053; G01R 33/36; G01R 33/3614; G01R 33/3664; G01R 33/3628; G01R 33/3607
See application file for complete search history.

(56) References Cited

U.S. PATENT DOCUMENTS

| | | |
|---|---|---|
| 2019/0296709 A1* | 9/2019 | El-Rayis .................. H03H 7/40 |
| 2020/0076408 A1* | 3/2020 | Ninomiya ................. H03F 1/56 |
| 2023/0061226 A1* | 3/2023 | Chen .................. G01R 33/3628 |

FOREIGN PATENT DOCUMENTS

WO    2017055172 A2    4/2017

\* cited by examiner

*Primary Examiner* — Son T Le

(57) ABSTRACT

An impedance tuner in a magnetic resonance system include at least one of an amplitude tuning circuit and a phase tuning circuit. The amplitude tuning circuit includes M serially-connected amplitude tuners. Each amplitude tuner includes at least one microwave transmission line and a first switch circuit connected in parallel, wherein the first switch circuit controls the at least one microwave transmission line to be in an on state or an off state, respectively, and the value of M is a positive integer greater than or equal to 1. The phase tuning circuit includes a phase tuner, and the phase tuner includes P second microwave transmission lines and a second switch circuit, wherein the second switch circuit controls the P second microwave transmission lines to be in an on state or an off state, respectively, and the value of P is a positive integer greater than or equal to 2.

20 Claims, 8 Drawing Sheets

IMPEDANCE TUNER, MAGNETIC RESONANCE SYSTEM, TRANSMISSION APPARATUS, AND TRANSMISSION METHOD

CROSS REFERENCE

The present application claims priority and benefit of Chinese Patent Application No. 202210443790.5 filed on Apr. 26, 2022, which is incorporated herein by reference in its entirety.

FIELD OF THE INVENTION

Embodiments of the present invention relate to the technical field of medical devices, and in particular to an impedance tuner, a magnetic resonance system, a transmission apparatus, and a transmission method.

BACKGROUND OF THE INVENTION

Magnetic resonance (MR) imaging systems are widely used in the field of medical diagnosis. A magnetic resonance system generally has a main magnet, a gradient amplifier, a radio-frequency amplifier, a gradient coil, a transmit chain module, a transmit/receive coil, a receive chain module, etc. The transmit chain module generates a pulse signal and transmits the same to the transmit/receive coil. The transmit/receive coil generates a radio-frequency excitation signal to excite a scanned subject to generate a magnetic resonance signal. After the excitation, the transmit/receive coil receives the magnetic resonance signal, and a medical parameter image is reconstructed according to the magnetic resonance signal.

In the conventional radio-frequency transmit chain module of a magnetic resonance system, the signal generated by the radio-frequency power amplifier which is outside a scan room (e.g., equipment room) is transmitted through cables, etc., to a body coil located in the scan room. Since the input impedance of the coil will change along with the weight of the scanned subject, according to the load-pull theory, the change of load impedance will cause a change of radio-frequency amplifier output characteristics, which undoubtedly affects the performance of the transmit chain module (such as fidelity, B1 field strength, etc.). Therefore, in the conventional technology, normally an isolator is added between the power amplifier and the coil in the equipment room, so as to shield the effects of the coil-reflected signal on the power amplifier, thereby offsetting the impact of load impedance on the amplifier gain. The foregoing approach will cause higher radio-frequency power loss, and the hardware architecture is complex and costly.

BRIEF DESCRIPTION OF THE INVENTION

Provided in the embodiments of the present invention are an impedance tuner, a magnetic resonance system, a transmission apparatus, and a transmission method.

According to an aspect of the embodiments of the present invention, an impedance tuner is provided, the impedance tuner comprising: at least one of an amplitude tuning circuit and a phase tuning circuit.

The amplitude tuning circuit comprises M serially-connected amplitude tuners; each amplitude tuner comprises at least one first microwave transmission line and a first switch circuit connected in parallel, the first switch circuit being configured to control the at least one first microwave transmission line to be in an on state or an off state, respectively, and the value of M is a positive integer greater than or equal to 1.

The phase tuning circuit comprises a phase tuner, the phase tuner comprising P second microwave transmission lines and a second switch circuit, the second switch circuit being configured to control the P second microwave transmission lines to be in an on state or an off state, respectively, and the value of P is a positive integer greater than or equal to 2.

According to an aspect of the embodiments of the present invention, a transmission apparatus of a magnetic resonance system is provided, the apparatus comprises: a signal output unit, configured to generate and output a pulse signal; a radio-frequency power amplifier, configured to amplify the pulse signal; at least one impedance tuner of the foregoing aspect, for transferring the signal amplified by the radio-frequency power amplifier to a transmit coil of the magnetic resonance system in the same space as the radio-frequency power amplifier.

According to an aspect of the embodiments of the present invention, a magnetic resonance system is provided, the system comprises: a transmit coil; and the transmission apparatus according to the foregoing aspect.

According to an aspect of the embodiments of the present application, a transmission method of a magnetic resonance system is provided, the method comprises: generating and outputting a pulse signal by a signal output unit; amplifying the pulse signal by a radio-frequency power amplifier; transferring, by the impedance tuner described in the foregoing aspect, the signal amplified by the radio-frequency power amplifier to a transmit coil of the magnetic resonance system.

According to another aspect of the embodiments of the present application, a storage medium having a computer-readable program stored therein is provided, wherein the computer-readable program enables a computer to implement, in a device, the method described above.

With reference to the following description and accompanying drawings, specific embodiments of the examples of the present application are disclosed in detail, and manners in which the principle of the examples of the present application is employed are illustrated. It should be understood that the embodiments of the present application are not thereby limited in scope. Within the spirit and scope of the appended claims, the embodiments of the present application comprise various changes, modifications, and equivalents.

BRIEF DESCRIPTION OF THE DRAWINGS

The accompanying drawings are included to provide further understanding of embodiments of the present application, constitute a part of the specification, and are used to illustrate embodiments of the present application and set forth the principles of the present application together with textual description. Obviously, the accompanying drawings in the following description are merely some embodiments of the present application, and a person of ordinary skill in the art may obtain other embodiments according to the accompanying drawings without the exercise of inventive effort. In the accompanying drawings.

DETAILED DESCRIPTION

Figure 1:
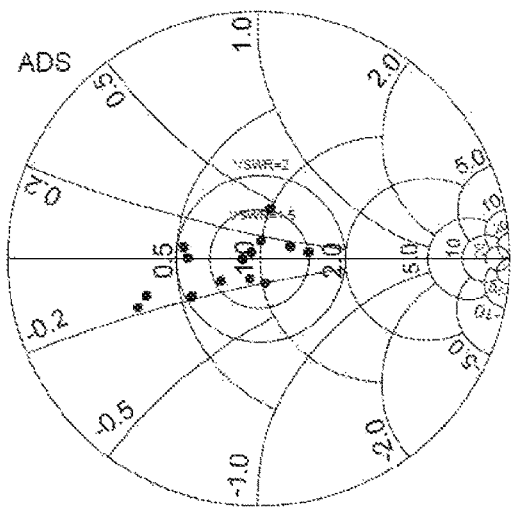
FIG. 1 is a schematic diagram of a Smith circle.

The foregoing and other features of the embodiments of the present application will become apparent from the following description with reference to the accompanying drawings. In the description and the accompanying drawings, specific embodiments of the present application are specifically disclosed, and part of the embodiments in which the principles of the examples of the present application may be employed are indicated. It should be understood that the present application is not limited to the described embodiments. On the contrary, the embodiments of the present application include all modifications, variations, and equivalents falling within the scope of the appended claims.

In the embodiments of the present application, the terms "first,", "second," etc., are used to distinguish different elements, but do not represent a spatial arrangement or temporal order, etc., of these elements, and these elements should not be limited by these terms. The term "and/or" includes any one of and all combinations of one or more associated listed terms. The terms "comprise," "include," "have," etc., refer to the presence of described features, elements, components, or assemblies, but do not exclude the presence or addition of one or more other features, elements, components, or assemblies. The terms "connect," "link," "couple," etc., used in the embodiments of the present invention are not limited to physical or mechanical connections, but may include electrical connections, whether direct or indirect.

In the embodiments of the present application, the singular forms "a," "the," etc., include plural forms, and should be broadly construed as "a type of" or "a class of" rather than limited to the meaning of "one." Furthermore, the term "said" should be construed as including both the singular and plural forms, unless otherwise specified in the context. In addition, the term "according to" should be construed as "at least in part according to . . . ," and the term "based on" should be construed as "at least in part based on . . . ," unless otherwise specified in the context.

The features described and/or illustrated for one embodiment may be used in one or more other embodiments in the same or similar manner, combined with features in other embodiments, or replace features in other embodiments. The term "include/comprise" when used herein refers to the presence of features, integrated components, steps, or assemblies, but does not preclude the presence or addition of one or more other features, integrated components, steps, or assemblies.

For ease of understanding, the following is a brief description of the relevant technology involved in the present disclosure.

The purpose of impedance matching is to allow all microwave signals to be transmitted to the load with little to no signal reflection back to the source point. The impedance (complex impedance) includes the real resistive part and the imaginary reactance part, which can be expressed as Z=R+jX. Impedance matching means that the load impedance (or input impedance on the load side) is equal to the impedance on the source side of the signal (moduli and amplitude angles are equal, or magnitudes and phases are equal, respectively).

In radio-frequency transmission applications (e.g., magnetic resonance transmit chain modules), return loss, reflection coefficient, and voltage standing wave ratio (VSWR) have always been important reference indicators to reflect radio-frequency load matching. For example, VSWR is the ratio of the voltage peak to the voltage valley of a traveling-standing wave (generated by reflected current and voltage on a transmission line), and VSWR is related to the reflection coefficient Γ as follows:

$$VSWR = \frac{1+\Gamma}{1-\Gamma}.$$

The ideal VSWR is 1:1, and the reflection coefficient is 0, which represents the impedance matching state. When the reflection coefficient modulus is 1, known as total reflection, there is no energy transfer, at which point VSWR is infinite, representing a complete impedance mismatch.

A Smith circle is an image tool used to draw and calculate, for example, the complex impedance, reflection coefficient, standing wave ratio, transmission line effect, etc. FIG. 1 is a schematic diagram of a Smith circle. Complex impedance can be converted into normalized impedance and then expressed on the Smith chart. Normalized impedance is equal to the actual impedance divided by the system impedance. As shown in FIG. 1, the normalized impedance of the center point of the Smith circle is 1. The main axis in the middle is a pure resistance axis (also known as the real axis). The rightmost point of the main axis in the middle represents infinite impedance (open circuit), while the leftmost point of the main axis in the middle represents a short circuit. The resistance values (R) on the circle which passes through the center point (impedance circle) in FIG. 1 are all 1. The arc extending from the point representing an open circuit (equal reactance arc) (X) represents that the reactance is a constant. The VSWR of each point on the same circle which is centered at the center point in FIG. 1 are all equal. FIG. 1 shows two circles with VSWR=1.5 and VSWR=2.0. Turning a full circle on the circle with VSWR=1.5 or VSWR=2.0 represents half the wavelength of the length of a transmission line. That is, the impedance of the transmission line will be repeated for every change of the length by a half wavelength. Turning half a circle represents one-quarter of the wavelength. That is, the end of the transmission line is an open circuit. When the length of the transmission line is one-quarter wavelength, the beginning thereof appears to be short-circuited. From the Smith circle, the process of impedance matching is to move the complex impedance (move along the circle) to a desired position (e.g., as close to the center as possible).

The embodiments of the present invention are specifically described below.

Embodiments of the present invention provide an impedance tuner, the impedance tuner including at least one of: an amplitude tuning circuit and a phase tuning circuit. The amplitude tuning circuit includes M serially-connected amplitude tuners, the value of M being a positive integer greater than or equal to 1, and the phase tuning circuit includes a phase tuner.

Thus, the impedance tuner in the embodiments of the present invention may include only the amplitude tuning circuit, or only the phase tuning circuit, or may include both the amplitude tuning circuit and the phase tuning circuit, and the phase tuner is serially connected to one of the amplitude tuners of the amplitude tuning circuit. Explanations are provided below, respectively.

Figure 2:
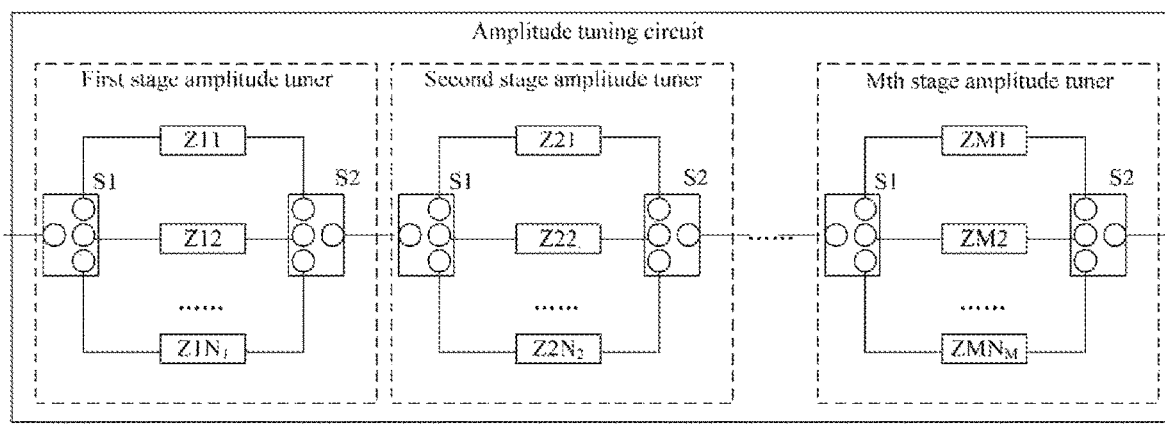
FIG. 2 is a schematic diagram of M serially-connected amplitude tuners according to an embodiment of the present application.

In some embodiments, the impedance tuner may include only an amplitude tuner circuit and the amplitude tuner circuit includes M serially-connected amplitude tuners. FIG. 2 is a schematic diagram of the M serially-connected amplitude tuners. As shown in FIG. 2, the M serially-connected amplitude tuners include a first stage amplitude tuner, a second stage amplitude tuner, . . . , and an Mth stage amplitude tuner, and the M amplitude tuners are sequentially connected (in series). Each amplitude tuner includes at least one first microwave transmission line and a first switch circuit which are connected in parallel, the first switch circuit being configured to control the at least one first microwave transmission line to be in an on state or an off state, respectively.

In an amplitude tuner, all of the at least one first microwave transmission lines are one-quarter wavelength in length $\lambda/4$, the at least one first microwave transmission line has the same or different characteristic impedance (also known as surge impedance), and the first switch circuit is configured to control the at least one first microwave transmission line to be in an on state or an off state, respectively. The on state means that the characteristic impedance of the corresponding first microwave transmission line is connected in parallel to the circuit, and the off state means that the characteristic impedance of the corresponding first microwave transmission line is not connected in parallel to the circuit, so that by controlling the at least one first microwave transmission line to be in an on state or an off state, respectively, a variety of impedance values for matching can be generated through combination (hereinafter also referred to as equivalent impedance).

Figure 3:
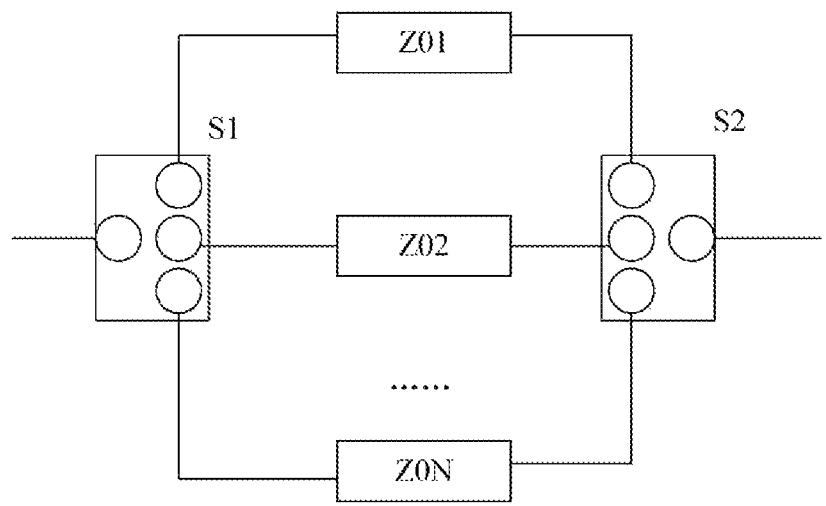
FIG. 3 is a schematic diagram of an amplitude tuner according to an embodiment of the present application.

FIG. 3 is a schematic diagram of an amplitude tuner. As shown in FIG. 3, the amplitude tuner includes at least one (N, e.g., N=3) first microwave transmission line connected in parallel and a first switch circuits (including switch circuits S1 and S2) for controlling the N first microwave transmission lines to be in an on state or an off state, respectively. The lengths of the N first microwave transmission lines are all one-quarter wavelength and the characteristic impedances are Z01, Z02, . . . , Z0N, and Z01, Z02, . . . , Z0N are completely the same or completely different or partially the same and partially different. For example, when N=4, and Z01, Z02, . . . , Z0N are completely different (each first microwave transmission line has a different length or width), by means of the control of the first circuit switch, the equivalent impedance of the amplitude tuner can be adjusted to be (also known as a characteristic impedance adjustment range (adjustable impedance)): Z01, Z02, Z03, Z04, Z01//Z02, Z01//Z03, Z01//Z04, Z02//Z04, Z02//Z03, Z03//Z04, Z01//Z02//Z03, Z01//Z02//Z04, Z01//Z03//Z04, Z02//Z03//Z04, Z01//Z02//Z03///Z04. Therefore, a variety of impedance values can be generated for matching through combination, i.e., the larger the value of N, the larger the adjustable impedance range can be.

For example, the characteristic impedance of at least one of the first microwave transmission lines may be taken independently, and may also meet a first condition, and the first condition may be that the Kth (K=(N−1)) power of the characteristic impedance of one of the microwave transmission lines is equal to the product of the characteristic impedances of the remaining microwave transmission lines. For example, when N=3, $Z01^{.2}=Z02 \times Z03$. The first condition is only an illustrative example and the embodiment of the present invention is not limited thereto.

In some embodiments, the amplitude tuning circuit may include one (M=1) amplitude tuner or at least two (M being greater than or equal to 2) amplitude tuners. When M=1, the amplitude tuner is implemented as shown previously (e.g., in FIG. 3), and when M≥2, the first stage amplitude tuner, the second stage amplitude tuner, . . . , and the Mth stage amplitude tuner are implemented as shown previously (e.g., in FIG. 2), however, the different amplitude tuners have the same or different number of first microwave transmission lines, and have the same or different characteristic impedance of the first microwave transmission lines.

For example, the first stage amplitude tuner includes $N_1$ first microwave transmission lines which are connected in parallel, and the characteristic impedances are Z11, Z12, . . . , and $Z1N_1$, respectively. The second stage amplitude tuner includes $N_2$ first microwave transmission lines which are connected in parallel, and the characteristic impedances are Z21, Z22, . . . , and $Z2N_2$, respectively. The Mth stage amplitude tuner includes $N_M$ first microwave transmission lines which are connected in parallel, and the characteristic impedances are ZM1, ZM2, . . . , and $ZMN_M$, respectively. N1, N2, . . . $N_M$ are completely the same or completely different or partially different and partially the same. The values of each impedance Z11, Z12, . . . , $Z1N_1$, the values of each impedance Z21, Z22, . . . , $Z2N_2$, and the values of each impedance ZM1, ZM2, . . . , $ZMN_M$ are completely the same or completely different or partially different and partially the same, and the embodiment of the present invention is not limited thereto.

In some embodiments, the different stages of amplitude tuners have the same or different equivalent impedance, and the different stages of amplitude tuners have the same or different characteristic impedance adjustment range (adjustable impedance), and the embodiment of the present invention is not limited thereto, and the values of the characteristic impedances of the first microwave transmission lines in the different stages of amplitude tuners are related or unrelated.

For example, the characteristic impedance of at least one first microwave transmission line in the first stage amplitude tuner, second stage amplitude tuner, . . . , and Mth stage amplitude tuner, a Yth stage amplitude tuner is related to the characteristic impedance of at least one first microwave transmission line in the (Y+1)th stage amplitude tuner adjacent to the Yth stage amplitude tuner. For example, the characteristic impedance of at least one first microwave transmission line in the Yth stage amplitude tuner is determined based on the characteristic impedance of at least one first microwave transmission line in the (Y+1)th stage amplitude tuner adjacent to the Yth stage amplitude tuner, with the value of Y being any value from 1 to M−1. For example, when Y=1, Z11 in the first stage amplitude tuner is determined based on Z21 and Z22 in the second stage amplitude tuner. For example, the square of Z11 is equal to the product of Z21 and Z22, which is an illustrative example only, and the embodiment of the present invention is not limited thereto.

For example, the characteristic impedance of least one first microwave transmission line in the first stage amplitude tuner, second stage amplitude tuner, . . . , and Mth stage amplitude tuner, the Yth stage amplitude tuner is determined based on the characteristic impedance of at least one first microwave transmission line in the (Y+1)th stage amplitude tuner adjacent to the Yth stage amplitude tuner, the VSWR after adjustment by the (Y+1)th stage amplitude tuner, and a target VSWR after adjustment by the Yth stage amplitude tuner, with the value of Y being any value from 1 to M−1. In other words, the characteristic impedance adjustment range (adjustable impedance) of the Yth stage amplitude tuner is determined based on the characteristic impedance adjustment range (adjustable impedance) of the (Y+1)th stage amplitude tuner adjacent to the Yth amplitude tuner, the VSWR after adjustment by the (Y+1)th stage amplitude tuner, and the target VSWR. For example, after adjustment by the Yth stage amplitude tuner, it is desired that the target VSWR is less than or equal to a first threshold. Thus, the characteristic impedance of each microwave transmission line in the Yth stage amplitude tuner can be determined based on the first threshold and the characteristic impedance of each first microwave transmission line in the (Y+1)th stage amplitude tuner (characteristic impedance adjustment range (adjustable impedance)), as well as the VSWR after the adjustment by the (Y+1)th stage amplitude tuner. Specific references can be made to the equations (1)-(2) described below for calculation, but the embodiment of the present invention is not limited thereto.

Therefore, in this embodiment, the multi-stage amplitude tuners allow further convergence of the impedance adjustment range (a region getting closer to the center) at each stage. That is, as the value of M gets larger, it causes further convergence of the impedance adjustment range, thereby making the impedance matching more accurate.

Figure 4:
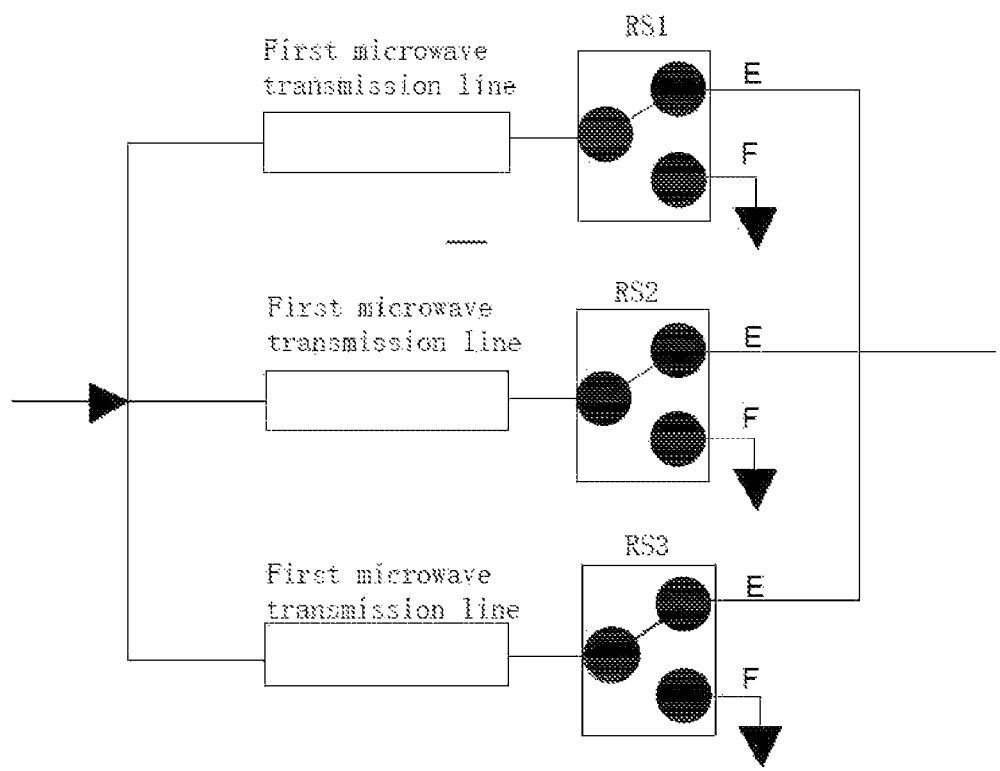
FIG. 4 is a schematic diagram of a first switch circuit according to an embodiment of the present application.

In some embodiments, the first switch circuit in each amplitude tuner is controlled so that each first microwave transmission line can be switched to be in an on state (enabled state) and off state (disabled state), and the first switch circuit can be implemented by using any existing switch circuit or state switch circuit. FIG. 4 is a schematic diagram of the first switch circuit. As shown in FIG. 4, the first switch circuit includes switches RS1, RS2, and RS3 corresponding to each first microwave transmission line. When RS1, RS2, and RS3 are connected to point E, the corresponding first microwave transmission line is enabled, and when RS1, RS2, and RS3 are connected to point F, the corresponding first microwave transmission line is disabled. This is only an illustrative example, and the embodiment of the present invention is not limited thereto. The first switch circuit can also be implemented by other means, as will be described in the later embodiments of the transmission apparatus. In addition, how the first switch circuit in each amplitude tuner determines whether each first microwave transmission line is in an on state or an off state will be explained below.

Figure 5:
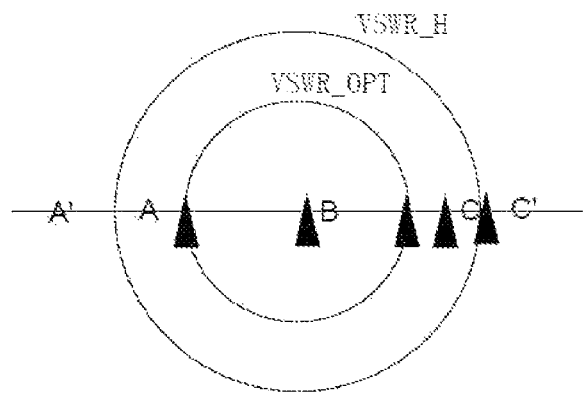
FIG. 5 is a simplified schematic diagram of a Smith circle.
Figure 6:
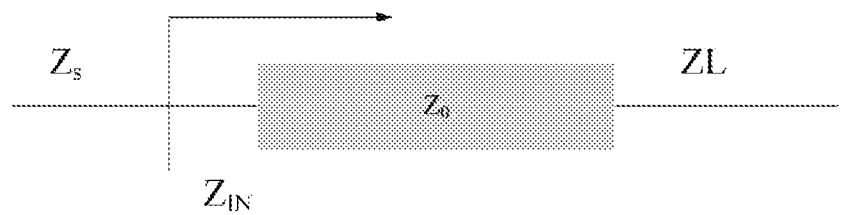
FIG. 6 is a simplified schematic diagram of impedance.

The following illustrates the working principle of impedance matching for the M serially-connected amplitude tuners with reference to the Smith circle and equations. Taking M=1 as an example, assuming that the impedance is purely resistive, i.e., including only the real part and not the imaginary part, FIG. 5 is a simplified schematic diagram of a Smith circle, and as shown in FIG. 5, the impedances are all located on the real axis. The goal of the amplitude tuner is to cause the load-side input impedance, after impedance tuning (e.g., the body coil input impedance described below), to be as close to the center point Z as possible. FIG. 6 is a simplified schematic diagram of impedance. As shown in FIG. 6, the load resistance ZL=R+jX. However, assuming X=0 herein, then the amplitude tuner equivalent impedance $Z_0=\sqrt{Z_s R}$, where $Z_s$ is the source impedance, and input impedance $$Z_{in} = \frac{Z_0^2}{ZL} = \frac{Z_s R}{ZL}, \quad \text{equation (1)}$$

and reflection coefficient $$\Gamma = \frac{Z_{in} - Z_s}{Z_{in} + Z_s} = \frac{VSWR - 1}{VSWR + 1}. \quad \text{equation (2)}$$

As shown in FIG. 5 and the following Table 1, if the input impedance is located on the real axis in the A region or C region, after impedance tuning, the switches RS1, RS2, and RS3 in the amplitude tuner in FIG. 4 are connected to points E, E, and F, respectively. That is, the amplitude tuner equivalent impedance is Z03. The input impedance can be at least moved to the real axis in the B region, which can change the value of the VSWR from [VSWR_OPT, VSWR_H] range to [1, VSWR_OPT]. If the input impedance is located on the real axis in the A' region or C' region, after impedance tuning, the switches RS1, RS2, and RS3 in the amplitude tuner are connected to points E, E, and F, respectively. That is, the amplitude tuner equivalent impedance is Z03, which can reduce the value of the VSWR by half. That is, the impedance matching effect is improved. The above description is made by taking M=1 and N=3 as an example only, and the embodiment of the present invention is not limited thereto. For example, the larger the values of M and N are, the closer the input impedance will be to the center point Z after impedance tuning.

TABLE 1

| Region | RS1 | RS2 | RS3 | VSWR before matching | VSWR after matching |
|---|---|---|---|---|---|
| A | 2 | 2 | 1 | [VSWR_OPT, VSWR_H] | [1, VSWR_OPT] |
| B | 1 | 2 | 2 | [1, VSWR_OPT] | [1, VSWR_OPT] |
| C | 2 | 2 | 1 | [VSWR_OPT, VSWR_H] | [1, VSWR_OPT] |
| A' | 2 | 2 | 1 | VSWR | VSWR/2 |
| C' | 2 | 2 | 1 | VSWR | VSWR/2 |

It should be noted that even if X is not 0, the impedance matching effect can be improved by using only the amplitude tuner when X and R satisfy a second condition, for reasons that will be explained later in the transmission apparatus embodiment.

Figure 7:
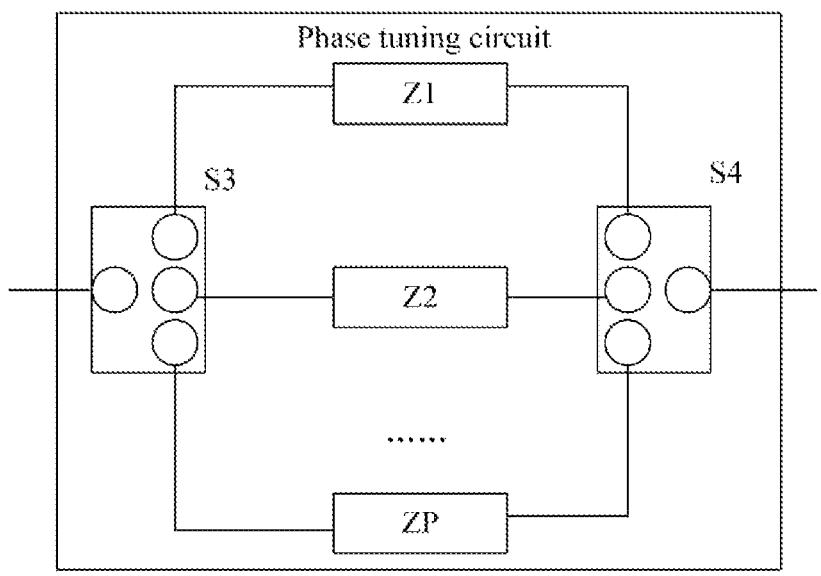
FIG. 7 is a phase tuner according to an embodiment of the present application.

In some embodiments, the impedance tuner may include a phase tuner circuit which includes a phase tuner. FIG. 7 is a schematic diagram of the phase tuner. As shown in FIG. 7, the phase tuner includes P second microwave transmission lines and a second switch circuit. The second switch circuit S3+S4 is configured to control the P second microwave transmission lines to be in an on state or an off state, respectively. The value of P is a positive integer greater than or equal to 2.

In some embodiments, the characteristic impedances of the P second microwave transmission lines Z1, Z2, . . . , and ZP are the same. For example, all the characteristic impedances of the second microwave transmission lines are a system impedance (standard impedance) 50Ω, but the present invention is not limited thereto. For example, the impedance can also be 75Ω or 300Ω, etc.

In some embodiments, the P second microwave transmission lines have the same or different phase (length). For example, the phases of the P second microwave transmission lines are respectively $360°\times a_1$, $360°\times a_2$, $360°\times a_3$, . . . , and $360°\times a_P$, or the lengths of the P second microwave transmission lines are $a_1\lambda$, $a_2\lambda$, $a_3\lambda$, . . . , $a_P\lambda$, $a_1$, $a_2$, $a_3$, . . . , and $a_P$ which are completely the same or completely different, or partially the same and partially different, wherein the P second microwave transmission lines include at least one second microwave transmission line having a length of one-half wavelength, or the P second microwave transmission lines include at least one second microwave transmission line having a phase of 180°, i.e., in $a_1$, $a_2$, $a_3$, . . . , and $a_P$, at least one of the values is one-half, but the embodiment of the present invention is not limited thereto, and none of $a_1$, $a_2$, $a_3$, . . . , and $a_P$ may be one-half.

In some embodiments, the phase (length) difference between adjacent second microwave transmission lines in the remaining second microwave transmission lines is the same, except for the second microwave transmission line having a length of one-half wavelength. For example, the phase (length) difference of the adjacent second microwave transmission lines is equal to $360°\times a$ ($a\lambda$), $a_1=\frac{1}{2}$, i.e., $a_2-a_3=a_3-a_4=\ldots a_{P-1}-a_P=a$. The embodiment of the present invention does not limit the value of a, and the value of a can be related or not related to P, e.g., $a=1/P^2$, which is only an illustrative description. The phase (length) difference of the adjacent second microwave transmission lines can also be completely different or partially the same and partially different. No further examples will be given herein.

For example, when P=4, the 4 second microwave transmission lines include a microstrip line having the length of $\lambda/2$ (phase 180°), a microstrip line having the length of $\lambda/8$ (phase 45°), a microstrip line having the length of $\lambda/16$ (phase 22.5°), and a microstrip line having the length of $3\lambda/16$ (phase 67.5°). Except for the microstrip line having the length of $\lambda/2$, the length (phase) difference between the remaining adjacent microstrip lines is $\lambda/16$ (phase 22.5°). This is only an illustrative example, and the embodiment of the present invention is not limited thereto.

In some embodiments, through the control of the second switch circuit in the phase tuner, each second microwave transmission line can be switched between an on state (enabled state) and an off state (disabled state). The second switch circuit can be implemented using any existing switch circuit or state switch circuit. For example, the second switch circuit includes a toggle switch connected to each second microwave transmission line, and a third microwave transmission line connected to point F of each toggle switch. That is, there are P third microwave transmission lines, and the other end of the P third microwave transmission lines is grounded. The P third microwave transmission lines correspond to the P second microwave transmission lines one to one. The characteristic impedances of the P third microwave transmission lines are the same. For example, all the characteristic impedances of the third microwave transmission lines are the system impedance (standard impedance) 50Ω, but the present invention is not limited thereto. For example, the impedance can also be 75Ω or 300Ω, etc. The sum of the length (phase) of the second microwave transmission line and the length (phase) of the corresponding third microwave transmission line is equal to an odd multiple of one-quarter wavelength (90°), but the present invention is not limited thereto. By arranging the third microwave transmission line in the second switch circuit, one end of the third microwave transmission line is grounded after the toggle switch is switched to point F. As the microwave transmission line of the branch (the sum of the length of the second microwave transmission line and the length of the third microwave transmission line) is an odd multiple of one-quarter wavelength, the branch can achieve the effect of an open circuit (disconnection), so there will be no effect on the other branch microwave transmission line, which is only an illustration herein, and the present invention is not limited thereto. The second switch circuit can also be arranged without the third microwave transmission lines. No further examples will be given herein.

Figure 8:
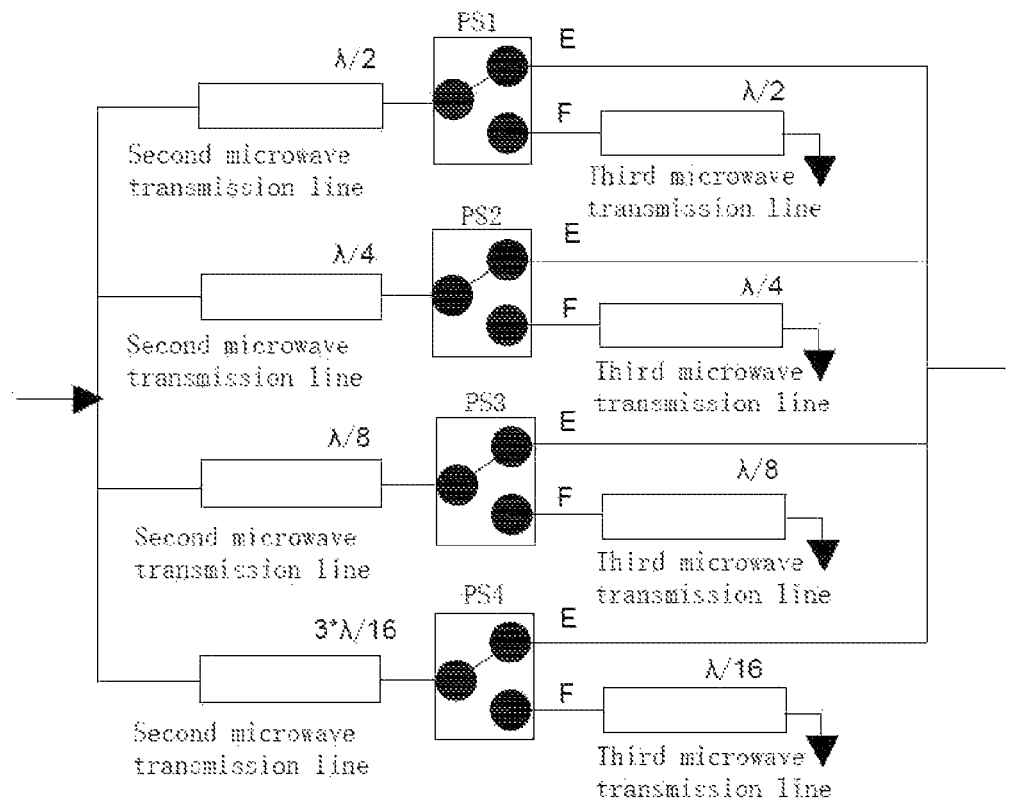
FIG. 8 is a schematic diagram of a second switch circuit according to an embodiment of the present application.

FIG. 8 is a schematic diagram of the second switch circuit. As shown in FIG. 8, the second switch circuit includes switches PS1, PS2, PS3, and PS4 corresponding to each second microwave transmission line, and a third microwave transmission line connected to point F of each switch. The characteristic impedances of the P third microwave transmission lines are the same, which is 50Ω, and the lengths $b_1$, $b_2$, $b_3$, and $b_4$ are $\lambda/4$, $3\lambda/16$, $\lambda/8$, and $\lambda/16$, sequentially. The corresponding lengths of the second microwave transmission lines $c_1$, $c_2$, $c_3$, and $c_4$ are $\lambda/2$, $\lambda/16$, $\lambda/8$, and $3\lambda/16$, sequentially, wherein $c_2+b_2=c_3+b_3=c_4+b_4=\lambda/4$, and $c_1+b_1=3\lambda/4$. When the corresponding second microwave transmission lines are connected to point E at PS1, PS2, PS3, and PS4, the corresponding second microwave transmission lines are enabled (on state), and when connected to point F at RS1, RS2, and RS3, the corresponding first microwave transmission lines are disabled (off state), which is only an illustration herein, and the present invention is not limited thereto. The second switch circuit can also be implemented in other ways. In addition, it will also be described below as to how the second switch circuit in the phase tuner determines whether the second microwave transmission line is in an on state or an off state.

The first microwave transmission line, the second microwave transmission line and the third microwave transmission line being a microstrip line is taken as an example above for the purpose of illustration. However, the present invention is not limited thereto. For example, the foregoing can also be coaxial lines, etc. No further examples will be given herein.

Figure 9:
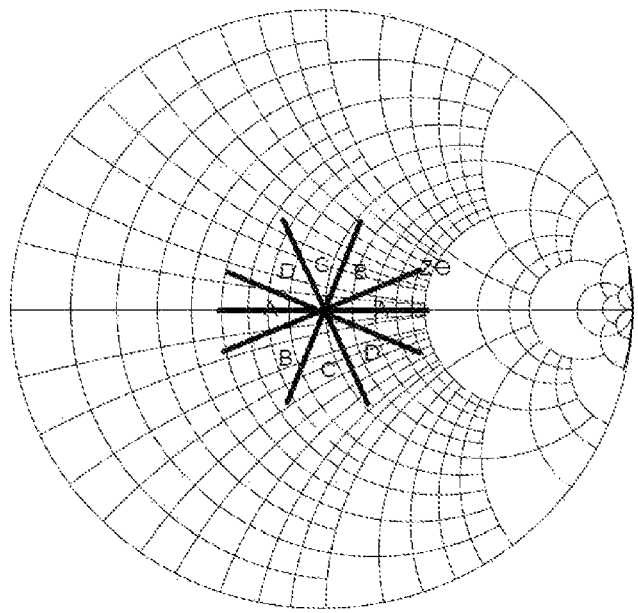
FIG. 9 is a simplified schematic diagram of a Smith circle.

The working principle of the phase tuner impedance matching is illustrated below with reference to the Smith circle and equations. Different from the assumption in the aforementioned FIG. 5, the load impedance, in addition to including the real part, also includes the imaginary part. In other words, the load impedance is not always on the real axis of the Smith circle. The load resistance $Z_r=R+jX$, and R and X are not 0. FIG. 9 is a simplified schematic diagram of a Smith circle. As shown in FIG. 9, the input impedance can be located in region A or B or C or D, and not located on the real axis. The objective of the phase tuner is to cause the input impedance to be as close to the real axis as possible after impedance tuning. Herein, set $$\theta = \frac{2\pi}{2 \times 2^P} = \frac{\pi}{2^P},$$

$$Z_\theta = \frac{Z_r Z_w^2 + Z_w^2 Z_r \tan^2\theta + j(Z_w^3 \tan\theta - Z_r^2 \tan\theta)}{Z_w^2 + Z_r^2 \tan^2\theta},$$

and $Z_\theta$ denotes the impedance value of the microwave transmission line at a certain location θ (length) corresponding to the phase. $Z_w$ is the characteristic impedance of the second transmission line, for example, 50Ω. The input impedance after impedance tuning can be determined according to $Z_\theta$. As shown in FIG. 9 and Table 2 below, if the input impedance is located in region B, after impedance tuning, switches PS1, PS2, PS3, and PS4 in the phase tuner in FIG. 8 are connected to points F, F, F, and E, respectively, which can cause the input impedance to move to region A (i.e., closer to the real axis). Similarly, if the input impedance is located in region C, after impedance tuning, switches PS1, PS2, PS3, and PS4 in the phase tuner in FIG. 8 are connected to points E, E, F, and E, respectively, which can cause the input impedance to move to region A (i.e., closer to the real axis), and if the input impedance is located in region D, after impedance tuning, switches PS1, PS2, PS3 and PS4 in the phase tuner in FIG. 8 are connected to points F, E, F, and F, respectively, which can cause the input impedance to move to region A (i.e., closer to the real axis). That is, the impedance matching effect is improved, and the phase tuner can keep the input impedance phase in region A, i.e., within 168.75–11.25/78.75–101.25 degrees. An example, when P=4 and the phases of the second microwave transmission lines $a_1$, $a_2$, $a_3$, and $a_4$ are λ/2, λ/16, λ/8, and 3λ/16, sequentially, is taken above for the purpose of illustration only, and the embodiment of the present invention is not limited thereto. For example, the larger the value of P is, the greater the range of the adjustable phase can be, and theoretically the range can approach 180°, and region A can be as small as possible. In other words, the input phase can infinitely approach the real axis.

TABLE 2

| Region | PS1 | PS2 | PS3 | PS4 | Phase before matching | Phase after matching |
|---|---|---|---|---|---|---|
| A | 1 | 2 | 2 | 2 | 168.75-11.25/ 78.75-101.25 | 168.75-11.25/ 78.75-101.25 |
| B | 2 | 2 | 2 | 1 | 11.25-33.75/ 101.25-123.75 | |
| C | 2 | 2 | 1 | 2 | 33.75-56.25/ 123.75-146.25 | |
| D | 2 | 1 | 2 | 2 | 56.25-78.75/ 146.25-168.75 | |

Figure 10:
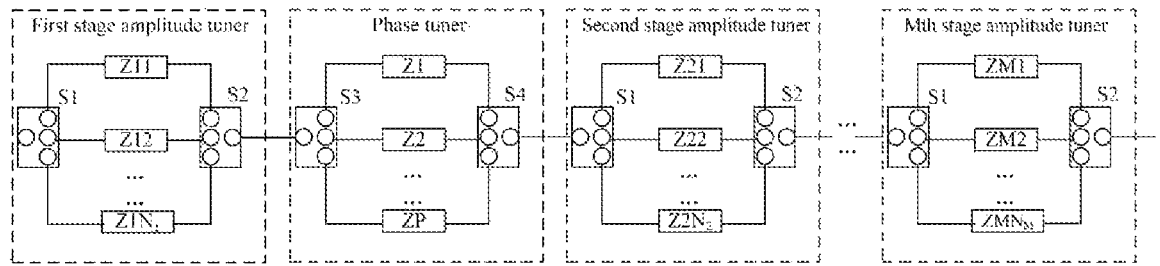
FIG. 10 is a schematic diagram of an impedance tuner according to an embodiment of the present application.
Figure 11:
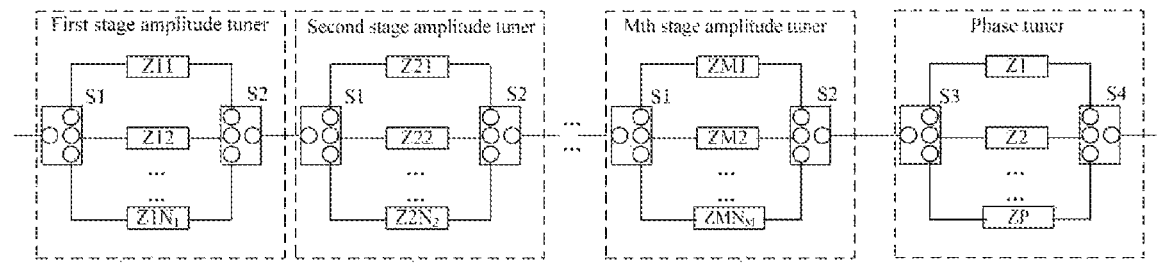
FIG. 11 is a schematic diagram of an impedance tuner according to an embodiment of the present application.
Figure 12:
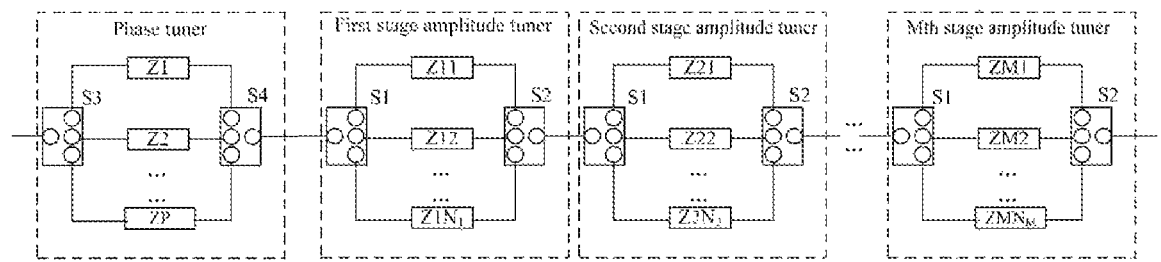
FIG. 12 is a schematic diagram of an impedance tuner according to an embodiment of the present application.

In some embodiments, the impedance tuner may include an amplitude tuning circuit and a phase tuning circuit, which are implemented as previously described and will not be repeated herein. The phase tuner can be serially connected to the first stage amplitude tuner, and can also be serially connected to the Mth stage amplitude tuner. FIG. 11 and FIG. 12 are schematic diagrams of the above two types of impedance tuners. The embodiment of the present invention is not limited thereto. Alternatively, the phase tuner can also be serially connected to other amplitude tuners. FIG. 10 is a schematic diagram of the impedance tuner. Through a joint tuning by the amplitude tuner and the phase tuner, the input impedance can be made to be closer to the center point Z after impedance tuning, thereby reducing the VSWR.

In some embodiments, the impedance tuner can be applied between amplifier circuits at various stages, or can also be applied between the amplifier circuit and the load, between a signal and a transmission circuit, etc. The embodiment of the present invention is not limited thereto. For example, when the impedance tuner is applied to the amplifier circuit and the load, the first switch circuit can determine whether each first microwave transmission line in each amplitude tuner is in an on state or an off state based on the value of the actual load impedance and a first relationship table. The first relationship table contains correspondences between multiple load impedance ranges and each first microwave transmission line state (similar to Table 1). When making the adjustment, it is possible to determine in which load impedance range the value of the actual load resistance falls, and to determine the state of each first microwave transmission line corresponding to the load impedance range, and also to control the first switch circuit to adjust each corresponding first microwave transmission line to be in an on state or an off state according to the determined state of each first microwave transmission line. Similarly, the second switch circuit can determine whether each second microwave transmission line in the phase tuner is in an on state or an off state based on the value of the actual load impedance and a second relationship table. The second relationship table contains correspondences between multiple load impedance ranges and each second microwave transmission line state (similar to Table 2). When making the adjustment, it is possible to determine in which load impedance range the value of the actual load resistance falls, and to determine the state of each second microwave transmission line corresponding to the load impedance range, and to control the second switch circuit to adjust each corresponding second microwave transmission line to be in an on state or an off state according to the determined state of each second microwave transmission line.

The above example illustrates a static impedance matching method, but the embodiment of the present invention is not limited thereto. For example, a real-time dynamic impedance matching method can also be employed. For example, when the impedance tuner is applied between the amplifier circuit and the load, the VSWR of the circuit can be measured in real time. When the VSWR is greater than a threshold, the first switch circuit sequentially adjusts each first microwave transmission line to be in an on state or an off state, or the second switch circuit sequentially adjusts each second microwave transmission line to be in an on state or an off state, or the first switch circuit sequentially adjusts each first microwave transmission line to be in an on state or an off state and the second switch circuit sequentially adjusts each second microwave transmission line to be in an on state or an off state, until the measured VSWR is less than or equal to the threshold. In other words, the first switch circuit employs an iterative approach to change the state of each first microwave transmission line (e.g., change the on state to the off state, change the off state to the on state, etc.), respectively, and the second switch circuit employs an iterative approach to change the state of each second microwave transmission line (e.g., change the on state to the off state, change the off state to the on state, etc.), respectively, and the changed VSWR is measured. If the measured VSWR is less than or equal to the threshold, the tuning is stopped. If the measured VSWR is greater than the threshold, the state of each first microwave transmission line is changed again, or the state of each second microwave transmission line is changed, or the state of each first microwave transmission line and each second microwave transmission line is changed until the VSWR measured after the change is less than or equal to the threshold.

In some embodiments, the phase can be firstly adjusted and then the impedance value is adjusted (i.e., the input impedance is moved close to the real axis and then the input impedance is moved close to the center), or the impedance value can be firstly adjusted and then the phase is adjusted (i.e., the input impedance is moved close to the center and then the input impedance is moved close to the real axis), and the present invention is not limited thereto. For example, the second switch circuit can firstly change the state of each second microwave transmission line (such as change the on state to the off state, change the off state to the on state, etc.). After the current optimal VSWR is obtained, the state of each first microwave transmission line is then sequentially changed by the first switch circuit of each amplitude tuner. For M amplitude tuners, firstly the state of each first microwave transmission line in one stage of the amplitude tuner that is close to the load may be adjusted, and then the state of each first microwave transmission line at each stage of the amplitude tuner may be sequentially adjusted progressively forward. Alternatively, for example, firstly the state of each first microwave transmission line in one stage of the amplitude tuner that is close to the load may be adjusted, then the state of each first microwave transmission line at each stage of the amplitude tuner may be sequentially adjusted progressively forward, and finally the state of each second microwave transmission line is firstly changed by the second switch circuit. Alternatively, for example, the state of each second microwave transmission line may be changed firstly by the second switch circuit (e.g., changed from the on state to the off state, from the off state to the on state, etc.), and after obtaining the current optimal VSWR, the state of each first microwave transmission line is then sequentially changed by the first switch circuit of each amplitude tuner. After adjusting the state of each first microwave transmission line in one stage of the amplitude tuner, the state of each second microwave transmission line is firstly changed again by the second switch circuit. Then the current optimal VSWR is obtained, and then the state of each first microwave transmission line in the next-stage amplitude tuner is adjusted, and so on, until the measured VSWR is less than or equal to the threshold.

For example, as shown in FIG. 11, assuming that the phase tuner is close to the load side and the first stage amplitude tuner is close to the amplifier side, the state of each second microwave transmission line can be changed by the second switch circuit first, and then the state of each first microwave transmission line in the Mth stage amplitude tuner is adjusted after obtaining the current optimal VSWR, and then the state of each first microwave transmission line in the (M−1)th stage amplitude tuner is adjusted after obtaining the current optimal VSWR, and so on, until the state of each first microwave transmission line in the first stage tuner is adjusted. The above impedance matching method is only an illustrative example, and the embodiment of present invention is not limited thereto.

As can be seen from the above embodiments, the amplitude tuning circuit or phase tuning circuit in the impedance tuner can cause the load-side input impedance to be as close as possible to the source-side impedance, thereby improving the impedance matching effect and offsetting the impact of load variations on circuit performance.

An embodiment of the present invention further provides a transmission apparatus of a magnetic resonance system.

Figure 13:
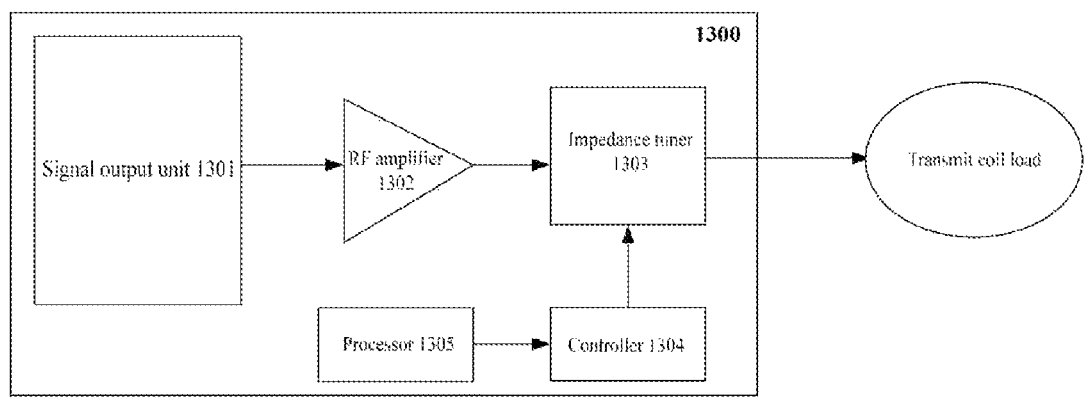
FIG. 13 is a schematic diagram of a transmission apparatus of a magnetic resonance system according to an embodiment of the present application.

FIG. 13 is a schematic diagram of the transmission apparatus of the magnetic resonance system according to the embodiment of the present invention. As shown in FIG. 13, the apparatus 1300 includes: a signal output unit 1301, configured to generate and output a pulse signal; a radio-frequency power amplifier 1302, configured to amplify the pulse signal; the impedance tuner 1303 of at least one embodiment of the foregoing aspect, for transferring the signal amplified by the radio-frequency power amplifier 1302 to a transmit coil of the magnetic resonance system which is in the same space as the radio-frequency power amplifier 1302.

In some embodiments, the cable through which the radio-frequency power is transmitted from the radio-frequency power amplifier to the coil introduces high radio-frequency power losses and has a complex and costly hardware architecture. In order to reduce the size, cost, and power loss of the radio-frequency transmit chain, so as to meet the overall demand for low cost, high performance, and miniaturization of the magnetic resonance system, the radio-frequency power amplifier can be moved into the scan room, thereby allowing the radio-frequency power amplifier to be close to the coil (radio-frequency source), and streamlining the hardware architecture and reducing the large number of radio-frequency power cables. Thus, the radio-frequency power amplifier 1302 and the transmit coil are in the same space, for example, in the scan room. More specifically, the radio-frequency power amplifier 1302 and the transmit coil can be arranged inside the housing of the transmission apparatus, etc., and the embodiment of present invention is not limited thereto.

Since isolators have magnetic components, isolators cannot operate in a highly magnetic environment, i.e., isolators cannot operate in the scan room. Therefore, when the radio-frequency power amplifier 1302 and the transmit coil are in the same space, i.e., the radio-frequency power amplifier is moved into the scan room, there is no effective solution to eliminate the impact of load changes on radio-frequency power amplifier performance (gain, efficiency, output power, etc.).

The embodiment of the present invention provides an impedance tuner between the radio-frequency power amplifier and the transmit coil when the radio-frequency power amplifier and the coil are arranged in the same space, through which the impedance tuner can improve the impedance matching effect and offset the effect of load variation on the performance of the radio-frequency power amplifier, and the transmission apparatus can work in a strong magnetic field environment, which can then meet the demand of miniaturization of the transmission apparatus, and also has a lower cost.

In some embodiments, the signal output unit 1301 may include a sequence generator, which may include a digital-to-analog converter and a radio-frequency front-end circuit. The sequence generator generates a desired scan sequence (radio-frequency pulse signal) during an MRI scan according to an instruction. The pulse signal may generate a radio-frequency field for triggering an inversion of the longitudinal magnetization vector of the scanned subject to produce a transverse magnetization vector. The transverse magnetization vector is spirally decayed at a fixed angular frequency around the external magnetic field to produce a free induction decay signal from which a magnetic resonance signal for imaging can be obtained. The sequence generator typically generates a low-power radio-frequency pulse signal. The sequence generator is connected to the radio-frequency power amplifier 1302, and the pulse signal is inputted into the radio-frequency power amplifier 1302.

The type of the scan sequence can be determined as required, and the embodiment of the present invention is not limited thereto. Optionally, the radio-frequency front-end circuit can also include a transmit attenuator, which is not shown in the figure, to control the attenuation degree of the pulse signal before inputting into the radio-frequency power amplifier 1302. Reference can be made to the prior art for the above specific embodiment of the sequence generator, and the present invention is not limited thereto.

In some embodiments, the radio-frequency power amplifier 1302 is configured to receive the low-power radio-frequency pulse signal outputted by the signal output unit 1301, perform amplification processing, and then output an amplified radio-frequency pulse signal. The radio-frequency power amplifier 1302 can perform a series of processing, such as analog-to-digital or digital-to-analog conversion, modulation amplification, filtering processing, etc., on the received radio-frequency pulse signal, so as to output a high-power radio-frequency pulse signal, thereby meeting imaging requirements of the magnetic resonance imaging system. For the structure and type of the radio-frequency power amplifier 1302, reference can be made to the prior art, and no further examples will be provided herein. In the following, the signal output unit and the radio-frequency power amplifier are referred to as a radio-frequency module for ease of explanation.

As the gain and efficiency characteristics of a power circuit inside the radio-frequency power amplifier 1302 are more sensitive to impedance, and performance is better in the case of impedance matching, the impedance tuner 1303 is required for impedance matching. The following is a description of how the impedance tuner 1303 can be applied to the transmission apparatus of a magnetic resonance system.

In some embodiments, the impedance tuner 1303 can include only a phase tuning circuit, and reference can be made to the previous example for an embodiment thereof. One side of the phase tuning circuit is connected to the radio-frequency power amplifier, and the other side is connected to a body coil. It should be noted that through matching by the phase tuning circuit, the performance (especially the efficiency) of the radio-frequency power amplifier can be significantly improved, which is less costly and simple to implement.

In some embodiments, the impedance tuner 1303 may include only an amplitude tuning circuit, and reference can be made to the previous example for an embodiment thereof. One side of the first stage amplitude tuner is connected to the radio-frequency power amplifier, and the other side of the Mth stage amplitude tuner is connected to the body coil.

$$\Gamma = \frac{Z_{in} - Z_s}{Z_{in} + Z_s} = \frac{-jX}{2R + jX}, \text{abs}\left(\frac{X}{R}\right) = \frac{VSWR - 1}{\sqrt{VSWR}}$$

can be obtained according to equations (1) (only the real part R is considered in equation (1) to calculate the equivalent impedance) and (2). That is, the relationship between abs(X/R) and VSWR is as shown in Table 3 below:

TABLE 3

| VSWR | abs(X/R) |
|---|---|
| 1 | 0 |
| 1.1 | 0.1 |

TABLE 3-continued

| VSWR | abs(X/R) |
|---|---|
| 1.2 | 0.18 |
| 1.3 | 0.26 |
| 1.4 | 0.34 |
| 1.5 | 0.41 |
| 1.6 | 0.47 |

When the impedance tuner is applied to the transmission apparatus of a magnetic resonance system, the real and imaginary parts of the load impedance obtained from the measurements are as shown in Table 4 below:

TABLE 4

| R | jX |
|---|---|
| 17.752 | −8.812 |
| 40.781 | −6.243 |
| 50.106 | −10.566 |
| 38.242 | −8.608 |
| 29.719 | −0.311 |
| ... | ... |

That is, in the vast majority of cases, it is possible to obtain abs(X/R) that is less than 0.41 (the second condition), and as shown in Table 3, the value of the VSWR is less than 1.5 when abs(X/R) is less than 0.41. That is, the impedance matching effect is good. Therefore, when the impedance tuner is applied to the transmission apparatus of a magnetic resonance system, the imaginary part can be disregarded and matching can be carried out with respect to the real part of the load impedance only. That is, only through the matching of the M amplitude tuners, the VSWR can also meet the target VSWR, thereby improving the impedance matching effect and enhancing the performance of the radio-frequency power amplifier (gain, efficiency, etc.), which is also less costly and simple to implement.

In some embodiments, the impedance tuner 1303 may include an amplitude tuning circuit and a phase tuning circuit, and reference can be made to the previous example for an embodiment thereof. Through a joint tuning of the amplitude tuning circuit and the phase tuning circuit, the input impedance passing through the body coil can be closer to the source impedance, so that the VSWR is as close to 1 as possible, thereby improving the performance (gain, efficiency, etc.) of the radio-frequency power amplifier. As shown in FIG. 11, the phase tuner can be connected to the body coil and the first stage amplitude tuner can be connected to the radio-frequency power amplifier. As shown in FIG. 12, the phase tuner can be connected to the radio-frequency power amplifier and the Mth stage amplitude tuner can be connected to the body coil. As shown in FIG. 10, the Mth stage amplitude tuner can be connected to the body coil and the first stage amplitude tuner can be connected to the radio-frequency power amplifier. No further examples will be given herein.

In some embodiments, the transmission apparatus 1300 may further include: a controller 1304 which adjusts the equivalent impedance of the impedance tuner 1303 to correspond to the load impedance of the transmit coil to achieve impedance matching.

In some embodiments, the controller 1304 controls the first switch circuit in the impedance tuner 1303 to adjust each first microwave transmission line to be in an on state or an off state to achieve impedance matching, or the controller 1304 controls the second switch circuit in the impedance tuner 1303 to adjust each second microwave transmission line to be in an on state or an off state to achieve impedance matching, or the controller 1304 controls the first switch circuit and the second switch circuit to adjust each first microwave transmission line and each second microwave transmission line in the impedance tuner 1303 to be in an on state or an off state to achieve impedance matching.

In some embodiments, for the embodiments of the first switch circuit and the second switch circuit, reference can be made to the previous embodiment. In addition to the embodiment of the previous example, when the impedance tuner is applied to the transmission apparatus of a magnetic resonance system, the controller 1304 can also control at least one of the first switch circuit and the second switch circuit using a high voltage signal and a current source signal of the transmission apparatus. In other words, the high voltage signal and the current source signal of the transmission apparatus can be used as a control signal of the first switch circuit to control the first microwave transmission line to be in an on state or an off state, and the high voltage signal and the current source signal of the transmission apparatus can be used as a control signal of the second switch circuit to control the second microwave transmission lines to be in an on state or an off state. The high voltage signal and the current source signal can be an existing biasing signal of a radio-frequency front-end diode in the magnetic resonance transmission apparatus.

The following is an example of the first switch circuit, which is similar to an embodiment of the second switch circuit, which will not be repeated herein.

Figure 14:
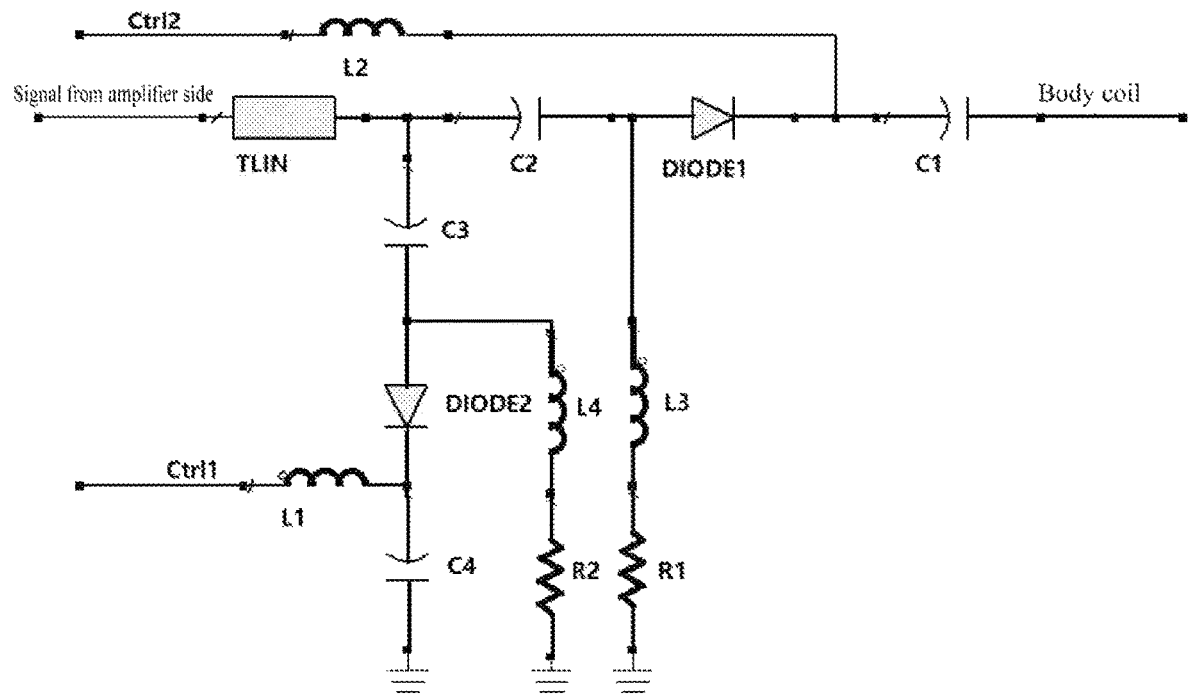
FIG. 14 is a schematic diagram of a switch circuit according to an embodiment of the present application.

FIG. 14 is a schematic diagram of a switch circuit corresponding to a first microwave transmission line. As shown in FIG. 14, the switch circuit includes: a first inductor L1, a second inductor L2, a third inductor L3, and a fourth inductor L4; a first capacitor C1, a second capacitor C2, a third capacitor C3, and a fourth capacitor C4; a first diode DIODE1 which is located between the third capacitor and the fourth capacitor and a second diode DIODE2 which is located between the first capacitor and the second capacitor, wherein two control signals ctrl1 and ctrl2 are inputted into the first inductor side and the second inductor side, respectively, and the other side is connected to an output side of the first diode and the second diode, respectively, and the microwave transmission line TLIN is connected to the second capacitor and the third capacitor, the third inductor is connected to an input side of the first diode, the fourth inductor is connected to an input side of the second diode, the first capacitor is connected to the body coil, and the microwave transmission line is connected to an output terminal of the radio-frequency power amplifier.

As shown in FIG. 14, when the second inductor is connected to the current source signal and the first inductor is connected to the high voltage signal, the current microwave transmission line is in an enabled state (on state), and conversely, when the first inductor is connected to the current source signal and the second inductor is connected to the high voltage signal, the current microwave transmission line is in a disable state (off state). The switch circuit directly utilizes a decoupling signal which is present in the magnetic resonance transmission apparatus. Therefore, the circuit is simple to implement and less costly.

In some embodiments, the static impedance matching method of the previous embodiment may be used, wherein the controller controls the first switch circuit to adjust each first microwave transmission line to be in an on state or an off state based on the body coil load impedance and the first relationship table, and controls the second switch circuit to adjust each second microwave transmission line to be in an on state or an off state based on the body coil load impedance and the second relationship table, or, alternatively, the real-time dynamic impedance matching method of the previous embodiment may be used. For example, the transmission apparatus may further include: a processor 1305 for measuring a standing wave ratio; when the standing wave ratio is greater than a threshold. The controller 1304 controls the first switch circuit to sequentially adjust each first microwave transmission line to be in an on state or an off state until the measured standing wave ratio is less than or equal to the threshold. In one embodiment, when the standing wave ratio is greater than a threshold, the controller 1304 controls the second switch circuit to sequentially adjust each second microwave transmission line to be in an on state or an off state until the measured standing wave ratio is less than or equal to the threshold. In another embodiment, when the standing wave ratio is greater than a threshold, the controller 1304 controls the first switch circuit and the second switch circuit to sequentially adjust each first microwave transmission line and each second microwave transmission line to be in an on state or an off state until the measured standing wave ratio is less than or equal to the threshold.

In some embodiments, the processor 1305 may be implemented as a general-purpose processor, digital signal processor (DSP), application-specific integrated circuit (ASIC), field-programmable gate array (FPGA), or other programmable logic device, discrete gate or transistor logic device, discrete hardware component, or any suitable combination thereof, for performing the functions described in the present invention. The embodiment of the present invention is not limited thereto.

In some embodiments, the impedance tuner 1303 can be adjusted to an initialized state when pre-scanning a subject to be examined, and then the processor measures the VSWR, and when the VSWR is greater than the threshold, the controller controls at least one of the first switch circuit and the second switch circuit to change the state of each microwave transmission line one by one using the real-time dynamic impedance matching method in the previous embodiment, and after each change, measures the changed VSWR until the measured VSWR is less than or equal to the threshold. For the real-time dynamic impedance matching method, references can be made to the previous embodiment, which will not be repeated herein. For the initialization state, each microwave transmission line may be in an on state or an off state, or the initialization state can also be determined according to a third relationship table. For example, the third relationship table includes correspondences between different weights of the subjects to be examined and the states of each microwave transmission line. According to the actual weight of the subject to be examined and the third relationship table, the state of each microwave transmission line can be determined and the initialization state can also be determined, thereby shortening the matching time.

In some embodiments, the transmission apparatus may include at least one (D of) impedance tuners 1303, the value of D being related to the number of transmit coil channels (e.g., the same). Each channel corresponds and connects to one impedance tuner, and the D impedance tuners may have the same or different type and number of tuners, as well as the same or different number, phase, and characteristic impedance values of the microwave transmission lines, and the embodiment of the present invention is not limited thereto.

Figure 15:
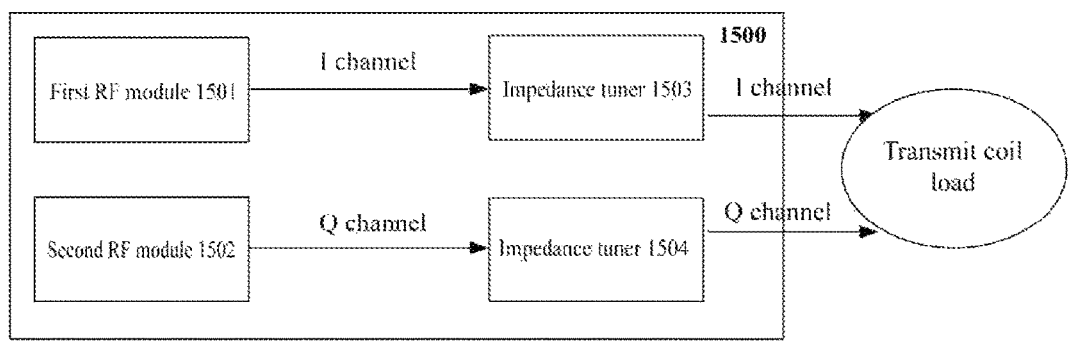
FIG. 15 is a schematic diagram of a transmission apparatus of a magnetic resonance system according to an embodiment of the present application.

In a 3 Tesla (T) magnetic resonance system, the value of D is 1 when the transmit coil is one channel, and is 2 when the transmit coil includes independent I and Q channels, i.e., two channels. No further examples will be provided herein. FIG. 15 is a schematic diagram of the structure of the dual-channel drive transmission apparatus, and as shown in FIG. 15, when the transmit coil (body coil) includes separate I channel and Q channel input ports, the transmission apparatus 1500 includes: a first radio-frequency module 1501 and a second radio-frequency module 1502, for driving the I channel and Q channel input ports, respectively. The embodiment of the first radio-frequency module 1501 and the second radio-frequency module 1502 has similar structure as described previously. A first impedance tuner 1503 is provided for transferring the signal amplified by the first radio-frequency module 1501 to the I channel input port of the transmit coil. Further, a second impedance tuner 1504 is provided for transferring the signal amplified by the second radio-frequency module 1502 to the Q channel input port of the transmit coil.

In some examples, embodiments of the first impedance tuner 1503 and the second impedance tuner 1504 are as previously described, which will not be repeated herein. The first impedance tuner 1503 and the second impedance tuner 1504 may have the same or different type and number of tuners, as well as the same or different number, phase, and characteristic impedance values of the microwave transmission lines, and the embodiment of present invention is not limited thereto. For example, the first impedance tuner 1503 and the second impedance tuner 1504 may both contain M amplitude tuners and a phase tuner, and the phase, as well as the characteristic impedance values, of the microwave transmission lines in each tuner are identical in number, or the first impedance tuner 1503 may include only a phase tuner, and the second impedance tuner may include only M amplitude tuners, or the first impedance tuner 1503 may include only M1 amplitude tuners, and the second impedance tuner may include only M2 amplitude tuners, M1 being not equal to M2, or the first impedance tuner 1503 may include only phase tuners, and the second impedance tuner may include only phase tuners, but the phases in the second microwave transmission lines of the two phase tuners are different. No further examples will be provided herein.

In some embodiments, the transmission apparatus 1500 may also include the controller and the processor, the embodiments thereof being similar to the controller 1304 and processor 1305, which will not be further described herein.

In some embodiments, the transmission apparatus 1300 or 1500 may further include: a signal processing unit (not shown in the figure) that outputs a feedback signal to the signal output unit. Optionally, the signal processing unit includes a transmit/receive mode-switching switch which is not shown in the figure, controlled by the pulse signal from the sequence generator to electrically connect the radio-frequency power amplifier and impedance tuner to the transmit coil of the magnetic resonance system during the transmit mode. In addition, the signal processing unit will receive a portion of reflected signals generated by the scanned subject.

In some embodiments, the feedback signal includes a forward feedback signal and a reverse feedback signal, the forward feedback signal being the feedback signal outputted directly from the signal processing unit, i.e., the feedback signal at the front end of the transmit coil, and the reverse feedback signal being the feedback signal returned from the transmit coil after the radio-frequency pulse signal is amplified and reaches the transmit coil, i.e., the feedback signal at the rear end of the transmit coil. For example, the signal processing unit may include a coupler, and the coupler may separate to a coupling end thereof a small portion of a sampled signal from the signal inputted from an input terminal, so that the processor can use the separated signal to obtain the forward power, reverse power, voltage standing wave ratio (VSWR), return loss, radio-frequency energy specific absorption ratio (SAR), and other indicators measuring the transmit chain module.

In some embodiments, the signal processing unit may further include a memory, which may store the relevant performance parameters of the coupler, a first relationship table, a second relationship table, etc. The memory may be an existing RAM memory, flash memory, removable media, hard drive, ROM memory, EPROM memory, EEPROM memory, etc., and the embodiment of the present invention is not limited hereto.

The processor and the controller may be separate modular components or may be placed in the signal processing unit or the signal output unit, or, alternatively, the functions of the processor and the controller may be integrated in the signal processing unit or the signal output unit, and the embodiment of the present invention is not limited thereto.

The impedance tuner and the signal processing unit can be integrated into the same circuit. For example, the coupler of the signal processing unit is arranged between the radio-frequency power amplifier and the impedance tuner, but the embodiment of present invention is not limited thereto.

For simplicity, the connection relationships or signal paths between the various components or modules are only shown as an example in FIGS. 13 to 15, but it should be clear to those skilled in the art that various related techniques such as bus connections can be employed. The various components or modules can be implemented by means of a hardware facility such as a processor, a memory, etc. The embodiments of the present application are not limited thereto.

It should be noted that the transmission apparatus may further include components not shown in FIG. 13 or 15. For details, reference can be made to the related art, and details are not repeated herein.

The above embodiments merely provide illustrative description of the embodiments of the present application. However, the present application is not limited thereto, and appropriate variations may be made on the basis of the above embodiments. For example, each of the above embodiments may be used independently, or one or more of the above embodiments may be combined.

From the above embodiments, it can be seen that the impedance tuner can improve the impedance matching effect when the radio-frequency power amplifier and the coil are arranged in the same space, and offset the effect of load variation on the performance of the radio-frequency power amplifier. The transmission apparatus can work in a strong magnetic field environment, and can meet the need for miniaturization of the transmission apparatus, and the cost is also lower.

Embodiments of the present invention further provide a transmission method of a magnetic resonance system. The same content as that in the embodiments of the foregoing aspect is not repeated herein.

Figure 16:
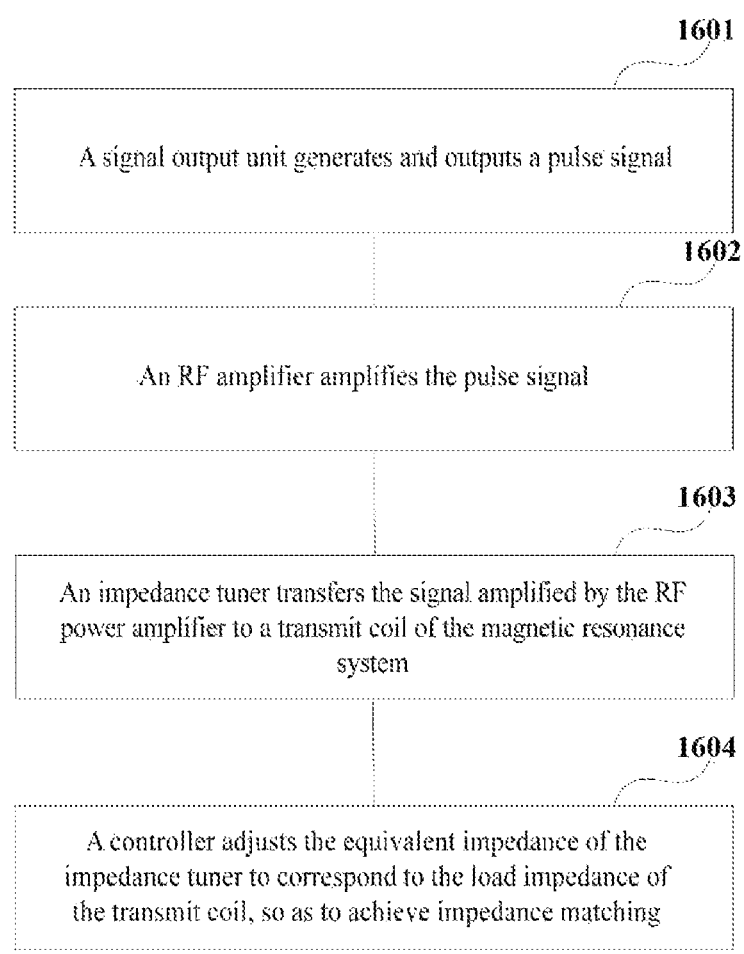
FIG. 16 is a schematic diagram of a transmission method according to an embodiment of the present application.

FIG. 16 is a schematic diagram of the transmission method of the magnetic resonance system according to an embodiment of the present invention. As shown in FIG. 16, the transmission method of the magnetic resonance system includes: at step 1601, generating and outputting a pulse signal by a signal output unit. At step 1602, the method includes amplifying the pulse signal by a radio-frequency power amplifier; and at step 1603 the method includes, transferring, by an impedance tuner, the signal amplified by the radio-frequency power amplifier to a transmit coil of the magnetic resonance system.

In some embodiments, the method may further include: 1604, adjusting, by a controller, the equivalent impedance of the impedance tuner to correspond to the load impedance of the transmit coil to achieve impedance matching.

In some embodiments, the step of adjusting by the controller the equivalent impedance of the impedance tuner to correspond to the load impedance of the transmit coil may include: measuring a standing wave ratio by the processor; when the standing wave ratio is greater than a threshold, controlling, by the controller, a first switch circuit to sequentially adjust each first microwave transmission line to be in an on state or an off state until the measured standing wave ratio is less than or equal to the threshold.

In another embodiment, when the standing wave ratio is greater than a threshold, the method includes controlling, by the controller, a second switch circuit to sequentially adjust each second microwave transmission line to be in an on state or an off state, until the measured standing wave ratio is less than or equal to the threshold.

Further in yet another embodiment, when the standing wave ratio is greater than a threshold, the method includes controlling, by the controller, a first switch circuit and a second switch circuit to sequentially adjust each first microwave transmission line and each second microwave transmission line to be in an on state or an off state, until the measured standing wave ratio is less than or equal to the threshold.

In some examples, for the embodiments of each of the described operations and the embodiments of a signal output unit, the radio-frequency power amplifier, and the impedance tuner, reference can be made to the preceding embodiments, which will not be repeated herein.

It should be noted that FIG. 16 merely schematically illustrates the embodiment of the present invention, but the present invention is not limited thereto. For example, the order of execution between operations may be suitably adjusted. In addition, some other operations may also be added or some of these operations may be omitted. Those skilled in the art can make appropriate variations according to the above disclosure, rather than being limited by the disclosure of FIG. 16.

The above embodiments merely provide illustrative descriptions of the embodiments of the present application. However, the present application is not limited thereto, and appropriate variations may be made on the basis of the above embodiments. For example, each of the above embodiments may be used independently, or one or more of the above embodiments may be combined.

From the above embodiments, it can be seen that the impedance tuner can improve the impedance matching effect when the radio-frequency power amplifier and the coil are arranged in the same space and offset the effect of load variation on the performance of the radio-frequency power amplifier. The transmission apparatus can work in a strong magnetic field environment, and can meet the need for miniaturization of the transmission apparatus, and the cost is also lower.

An embodiment of the present application further provides a magnetic resonance imaging system.

Figure 17:
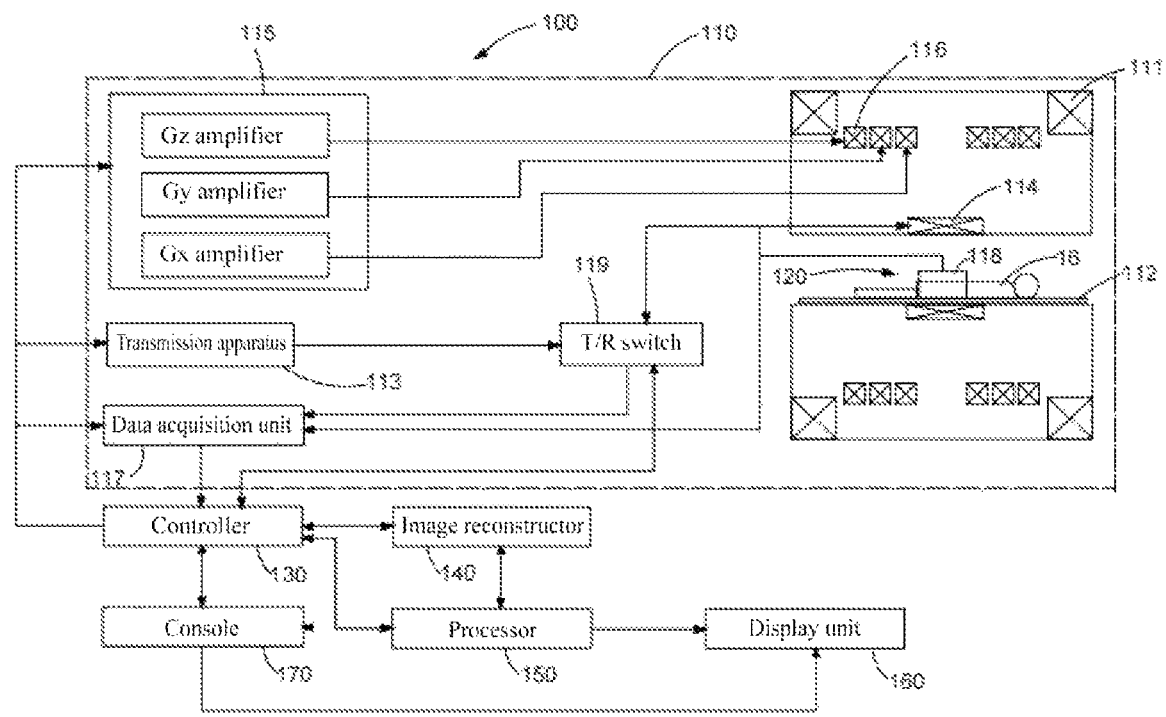
FIG. 17 is a schematic diagram of a magnetic resonance imaging system according to an embodiment of the present application.

FIG. 17 is a schematic diagram of the composition of the magnetic resonance imaging system. As shown in FIG. 17, the system 1700 includes: a scanning unit 110. The scanning unit 110 is configured to perform a magnetic resonance scan of a subject (e.g., a human body) 16 to generate image data of a region of interest of the subject 16, wherein the region of interest may be a pre-determined anatomical site or anatomical tissue.

The magnetic resonance imaging system 1700 may include a controller 130 which is coupled to the scanning unit 110 that indicates an MRI scan sequence to be performed during the MRI scan, so as to control the workflow of the scanning unit 110 when the scanning unit 110 performs the magnetic resonance scan.

The scanning unit 110 may include a main magnet assembly 111. The main magnet assembly 111 usually includes an annular superconducting magnet defined in a housing. The annular superconducting magnet is mounted in an annular vacuum container. The annular superconducting magnet and the housing thereof define a cylindrical space surrounding the subject 16, such as an imaging space 120 shown in FIG. 17. The main magnet assembly 111 generates a constant magnetic field, i.e., a B0 field, in a Z direction of the imaging space 120.

Usually, the Z direction is typically the direction extending from the head to the feet (or from the feet to the head) when the subject 16 is positioned on a table 112. For example, a selected layer may be a slice at any position in the Z direction. A uniform portion of the B0 field is formed in a central region of the main magnet.

The scanning unit 110 further includes the table 112, which is configured to carry the subject 16 and travel, in response to the control of the controller 130, in the Z direction to enter or exit the imaging space 120. For example, in an embodiment, an imaging volume of the subject 16 may be positioned in a central region of the imaging space 120 having uniform magnetic field strength, so as to facilitate scanning and imaging of the imaging volume of the subject 16.

The magnetic resonance imaging system 100 uses the formed B0 field to transmit a static magnetic field to the subject 16 located in the imaging space, so that protons in a resonant region in the body of the subject 16 precess in an ordered manner.

The scanning unit 110 further includes a radio-frequency transmit coil 114 and the transmission apparatus 113 in the preceding embodiment. For the embodiment of the transmission apparatus 113, reference can be made to the preceding transmission apparatus 1300 or 1500, and the same content as in the preceding embodiment will not be repeated herein. The radio-frequency transmit coil 114 is configured, for example, to surround a region to be imaged of the subject 16. The radio-frequency transmit coil 114 may include, for example, a body coil disposed along an inner circumference of the main magnet, or a local coil dedicated to local imaging. The transmission apparatus is configured to drive the radio-frequency transmit coil 114 and create a high frequency magnetic field in space. The transmission apparatus 113 outputs an amplified pulse signal to the radio-frequency transmit coil 114, causing the radio-frequency transmit coil 114 to transmit a radio-frequency field B1 orthogonal to the B0 field to the subject 16 to excite the proton spins in the slice to be imaged, and after the radio-frequency excitation pulse ends, a magnetic resonance signal is generated during the process of spin-relaxation of the excited protons returning to the initial magnetization vector.

The aforementioned radio-frequency transmit coil 114 may be connected to a transmit/receive (T/R) switch 119. The transmit/receive switch 119 is controlled so that the radio-frequency transmit coil may be switched between a transmit mode and a receive mode. In the receive mode, the radio-frequency transmit coil may be configured to receive, from the subject 16, a magnetic resonance signal having three-dimensional location information.

The three-dimensional location information of the magnetic resonance signal is generated by means of a gradient system of the MRI system, and this will be described in detail below.

The scanning unit 110 further includes a gradient coil driver 115 and a gradient coil assembly 116. The gradient coil assembly 116, in one aspect, forms a magnetic field gradient (a varying magnetic field) in the imaging space 120 so as to provide three-dimensional location information for the magnetic resonance signal, and in another aspect generates a compensating magnetic field of the B0 field to shim the B0 field.

The gradient coil assembly 116 may include three gradient coil systems, and the three gradient coil systems are configured to generate magnetic field gradients that are oblique to three spatial axes (for example, the X-axis, Y-axis, and Z-axis), respectively, which are perpendicular to one another. The gradient coil driver 115 drives the gradient coil assembly 116 on the basis of a control signal from the controller 130, and therefore generates the gradient magnetic field in the imaging space 120. The gradient coil driver 115 includes gradient amplifiers corresponding to the three gradient coil systems in the aforementioned gradient coil assembly, respectively. For example, the gradient coil driver 115 includes a Gz amplifier configured to drive a gradient in a z direction, a Gy amplifier configured to drive a gradient in a y direction, and a Gx amplifier configured to drive a gradient in an x direction.

More specifically, the gradient coil assembly 116 is configured to apply a magnetic field gradient in a slice selection direction (e.g., the z direction) to vary field strength in the region, so that precession frequencies of protons of imaged tissue in different layers (slices) of the region are different and thus layer selection is performed. Those skilled in the art understand that the layer is any one of a plurality of two-dimensional slices distributed in the Z direction in the three-dimensional imaging volume. When the imaging region is scanned, the radio-frequency transmit coil 114 responds to the aforementioned radio-frequency excitation signal, then a layer having a precession frequency corresponding to this radio-frequency excitation signal is excited. Further, the gradient coil assembly 116 is configured to separately apply a magnetic field gradient in a phase-encoding direction (e.g., the y direction) and a magnetic field gradient in a frequency-encoding direction (e.g., the x direction), so that magnetic resonance signals of excited layers have different phases and frequencies, thereby achieving phase encoding and frequency encoding.

The scanning unit 110 further includes a surface coil 118 which is usually arranged close to a scanned part (a region of interest) of the subject 16 (for example, covering or disposed on the body surface of the subject 16), and the surface coil 118 is also configured to receive the magnetic resonance signal.

The scanning unit 110 further includes a data acquisition unit 117 configured to acquire the magnetic resonance signal (for example, received by the body coil or the surface coil) in response to a data acquisition control signal of the controller 130. In an embodiment, the data acquisition unit 117 may include, for example, a radio-frequency preamplifier (not shown in the figure), a phase detector (not shown in the figure), and an analog/digital converter (not shown in the figure). The radio frequency preamplifier is configured to amplify the magnetic resonance signal. The phase detector is configured to perform phase detection on the amplified magnetic resonance signal. The analog/digital converter is configured to convert the phase-detected magnetic resonance signal from an analog signal into a digital signal.

The data acquisition unit 117 is further configured to store the digitized magnetic resonance signal (or echo) into a K-space in response to a data storage control signal of the controller 130. The K-space is a space to which raw data of magnetic resonance signals carrying spatial orientation encoding information is populated. The data acquisition unit 117, according to a predetermined data filling method, fills signals having different phase information and frequency information in the corresponding locations in the K-space. In an example, the two-dimensional K-space may include a frequency-encoding line and a phase-encoding line. Data acquisition at each level may include multiple signal acquisition cycles (or repetition times TR). Each signal acquisition cycle may correspond to one change in the magnetic field gradient (incrementally or decrementally) in the phase-encoding direction (i.e., one signal acquisition is performed for each phase-encoding gradient applied), and the magnetic resonance signal acquired in each signal acquisition cycle is filled into a frequency-encoding line. Through multiple signal acquisition cycles, multiple frequency-encoding lines having different phase information may be filled, and each acquired magnetic resonance signal has multiple decomposition frequencies.

The magnetic resonance imaging system 100 further includes an image reconstruction unit 140 configured to perform inverse Fourier transform on data stored in the K-space to reconstruct a three-dimensional image or a series of two-dimensional slice images of the imaging volume of the subject 16. Specifically, the image reconstruction unit 140 may perform the aforementioned image reconstruction on the basis of communication with the controller 130.

The magnetic resonance imaging system 100 further includes a processor 150. The processor 150 may include an image processor for image processing, and the image processor may perform any required image post-processing on the aforementioned three-dimensional image or any image in an image sequence. The post-processing may be an improvement or adaptive adjustment made to an image in any aspect of contrast, uniformity, sharpness, brightness, artifacts, etc. The processor 150 may further include a waveform processor configured to implement a waveform determination method according to an embodiment of the present invention. For example, the waveform processor generates a waveform on the basis of scanning parameters, performs waveform conversion, uses a converted waveform to determine driving/controlling parameters of the gradient amplifier, etc.

In one embodiment, the controller and processor of the transmission apparatus 113 may be provided independently of, or integrated with, the MR system controller 130 and processor 150, and the embodiment of present invention is not limited thereto. The controller 130, the image reconstructor 140, and the processor 150 may separately or collectively include a computer processor and a storage medium on which a program for predetermined data processing to be performed by the computer processor is recorded. For example, the storage medium may store a program for performing scan processing (e.g., including waveform design/conversion, etc.), image reconstruction, image processing, etc., and the storage medium may include, for example, ROM, a floppy disk, a hard disk, an optical disk, a magnetic disk, a CD-ROM, or a non-volatile memory card.

The magnetic resonance imaging system 100 further includes a display unit 160, and the display unit 160 may be configured to display an operation interface and various data, images, or parameters generated during data acquisition and processing processes.

The magnetic resonance imaging system 100 further an operation console 170, and the operation console 170 may include a user input device, such as a keyboard, a mouse, etc. The controller 130 may communicate with the scanning unit 110, the image reconstruction unit 140, the processor 150, the display unit 160, etc., in response to a control command generated by a user on the basis of the operation console 170 or an operation panel/button, etc., disposed on the housing of the main magnet.

Those skilled in the art can understand that when imaging scanning is performed on the subject 16, the controller 130 can use a sequence generator (not shown in the figure) to send a sequence control signal to the aforementioned components (for example, the transmission apparatus 113, the gradient coil driver 115, etc.) of the scanning unit 110, so that the scanning unit 110 executes a preset scan sequence.

Those skilled in the art can understand that the "scan sequence" (hereafter also referred to as imaging sequence or pulse sequence) refers to a combination of pulses having specific amplitudes, widths, directions, and timings and applied when a magnetic resonance imaging scan is performed. The pulses may typically include, for example, a radio-frequency pulse and a gradient pulse. The radio-frequency pulse may include, for example, a radio-frequency transmission pulse, a radio-frequency refocus pulse, an inverse recovery pulse, etc. The gradient pulses may include, for example, the aforementioned gradient pulse for layer selection, gradient pulse for phase encoding, gradient pulse for frequency encoding, phase balance pulse for phase balancing of proton precession, etc. Typically, a plurality of scanning sequences can be pre-set in the magnetic resonance imaging system, so that the sequence suitable for clinical examination requirements can be selected. The clinical examination requirements may include, for example, an imaging site, an imaging function, an imaging effect, etc.

From the above embodiments, it can be seen that the impedance tuner can improve the impedance matching effect when the radio-frequency power amplifier and the coil are set in the same space, and offset the effect of load variation on the performance of the radio-frequency power amplifier. The transmission apparatus can work in a strong magnetic field environment, and can meet the need for miniaturization of the transmission apparatus while having a lower cost.

Embodiments of the present invention further provide a scanning method of a magnetic resonance system, the method including: performing a pre-scan center frequency search and executing the transmission method.

With reference to FIG. 17, in some embodiments, after a subject to be scanned enters a scanning bore (that is, the imaging space defined by the main magnet), scan parameter configuration is performed. For example, the scan parameter configuration can be performed using the input device on the basis of a part under examination. The scan parameter configuration includes various conventional configurations of scan parameters such as a scanning range, a scanning protocol, etc.

During the process of pre-scanning, the center frequency needs to be corrected first to determine the best resonant frequency. The correction process includes: searching for a center frequency, and the identified center frequency should be the same as the precession frequency of the protons within the subject to be scanned.

In the transmission method, the signal output unit generates a set of pulse signals having the center frequency and outputs to the impedance tuner the set of pulse signals amplified by the RF amplifier, and the impedance tuner performs impedance tuning to achieve impedance matching and then a formal scan is performed.

In some embodiments, if a subsequent subject is to be scanned, or a different part is to be scanned, then the scanning method is implemented again.

The embodiments of the present invention further provide a computer-readable program. When the program is executed in a transmission apparatus or an MRI system, the program causes a computer to execute, in the transmission apparatus or the MRI system, the method according to the embodiments.

The embodiments of the present invention further provide a storage medium having a computer-readable program stored therein. The computer-readable program causes a computer to execute, in a transmission apparatus or an MRI system, the method according to the embodiments.

The above apparatus and method of the present application can be implemented by hardware, or can be implemented by hardware in combination with software. The present application relates to the foregoing type of computer-readable program. When executed by a logic component, the program causes the logic component to implement the foregoing apparatus or constituent part, or causes the logic component to implement various methods or steps as described above. The present application further relates to a storage medium for storing the above program, such as a hard disk, a magnetic disk, an optical disk, a DVD, a flash memory, etc.

The method/apparatus described with reference to the embodiments of the present application may be directly embodied as hardware, a software module executed by a processor, or a combination of the two. For example, one or more of the functional block diagrams and/or one or more combinations of the functional block diagrams shown in the drawings may correspond to either respective software modules or respective hardware modules of a computer program flow. The foregoing software modules may respectively correspond to the steps shown in the figures. The foregoing hardware modules can be implemented, for example, by firming the software modules using a field-programmable gate array (FPGA).

The software modules may be located in a RAM, a flash memory, a ROM, an EPROM, an EEPROM, a register, a hard disk, a portable storage disk, a CD-ROM, or any storage medium in other forms known in the art. The storage medium may be coupled to a processor, so that the processor can read information from the storage medium and can write information into the storage medium. Alternatively, the storage medium may be a component of the processor. The processor and the storage medium may be located in an ASIC. The software module may be stored in a memory of a mobile terminal, and may also be stored in a memory card that can be inserted into a mobile terminal. For example, if a device (such as a mobile terminal) uses a large-capacity MEGA-SIM card or a large-capacity flash memory device, the software modules can be stored in the MEGA-SIM card or the large-capacity flash memory device.

One or more of the functional blocks and/or one or more combinations of the functional blocks shown in the accompanying drawings may be implemented as a general-purpose processor, a digital signal processor (DSP), an application-specific integrated circuit (ASIC), a field-programmable gate array (FPGA) or other programmable logic devices, discrete gate or transistor logic devices, a discrete hardware assembly, or any appropriate combination thereof for implementing the functions described in the present application. The one or more functional blocks and/or the one or more combinations of the functional blocks shown in the accompanying drawings may also be implemented as a combination of computing devices, such as a combination of a DSP and a microprocessor, multiple microprocessors, one or more microprocessors in communication combination with a DSP, or any other such configuration.

The present application is described above with reference to specific embodiments. However, it should be clear to those skilled in the art that the foregoing description is merely illustrative and is not intended to limit the scope of protection of the present application. Various variations and modifications may be made by those skilled in the art according to the principle of the present application, and these variations and modifications also fall within the scope of the present application.

The invention claimed is:

1. An impedance tuner, characterized in that the impedance tuner comprises at least one of: an amplitude tuning circuit and a phase tuning circuit;
the amplitude tuning circuit comprises M serially-connected amplitude tuners; each amplitude tuner comprises at least one first microwave transmission line and a first switch circuit connected in parallel, the first switch circuit being configured to control the at least one first microwave transmission line to be in an on state or an off state, respectively, and the value of M is a positive integer greater than or equal to 1;
the phase tuning circuit comprises a phase tuner, the phase tuner comprising P second microwave transmission lines and a second switch circuit, the second switch circuit being configured to control the P second microwave transmission lines to be in an on state or an off state, respectively, and the value of P is a positive integer greater than or equal to 2;
wherein the impedance tuner further comprises: a controller configured to receive a measurement of a standing wave ratio; when the standing wave ratio is greater than a threshold, the controller is configured to sequentially adjust each first microwave transmission line to be in an on state or an off state via the first switch circuit until the measured standing wave ratio is less than or equal to the threshold.

2. The impedance tuner according to claim 1, wherein the length of the first microwave transmission line is one-quarter wavelength.

3. The impedance tuner according to claim 1, wherein the different amplitude tuners have the same or different number of the first microwave transmission lines; and
the different amplitude tuners have the same or different characteristic impedance of the first microwave transmission lines.

4. The impedance tuner according to claim 3, wherein the at least one first microwave transmission line has the same or different characteristic impedance.

5. The impedance tuner according to claim 3, wherein, when M is greater than 1, the characteristic impedance of at least one first microwave transmission line in the amplitude tuner is correlated with the characteristic impedance of at least one first microwave transmission line in an amplitude tuner adjacent to said amplitude tuner.

6. The impedance tuner according to claim 1, wherein the P second microwave transmission lines have the same characteristic impedance.

7. The impedance tuner according to claim 1, wherein the P second microwave transmission lines have the same or different phase or length.

8. The impedance tuner according to claim 1, wherein the P second microwave transmission lines comprise at least one second microwave transmission line having a length of one-half wavelength.

9. The impedance tuner according to claim 8, wherein except for the second microwave transmission line having a length of one-half wavelength, the adjacent second microwave transmission lines in the remaining second microwave transmission lines have the same phase difference or length difference.

10. The impedance tuner according to claim 1, wherein when the impedance tuner comprises the amplitude tuning circuit and the phase tuning circuit, the phase tuner is serially connected to one amplitude tuner in the amplitude tuning circuit.

11. A transmission apparatus of a magnetic resonance system, characterized in that the apparatus comprises:
a signal output unit, configured to generate and output a pulse signal;
a radio-frequency power amplifier, configured to amplify the pulse signal;
at least one impedance tuner for transferring the signal amplified by the radio-frequency power amplifier to a transmit coil of the magnetic resonance system in the same space as the radio-frequency power amplifier;
wherein the at least one impedance tuner comprises at least one of: an amplitude tuning circuit and a phase tuning circuit;
wherein the amplitude tuning circuit comprises M serially-connected amplitude tuners; each amplitude tuner comprises at least one first microwave transmission line and a first switch circuit connected in parallel, the first switch circuit being configured to control the at least one first microwave transmission line to be in an on state or an off state, respectively, and the value of M is a positive integer greater than or equal to 1;
wherein the phase tuning circuit comprises a phase tuner, the phase tuner comprising P second microwave transmission lines and a second switch circuit, the second switch circuit being configured to control the P second microwave transmission lines to be in an on state or an off state, respectively, and the value of P is a positive integer greater than or equal to 2;
wherein the apparatus further comprises: a processor, for measuring a standing wave ratio;
when the standing wave ratio is greater than a threshold, the processor controls the first switch circuit to sequentially adjust each first microwave transmission line to be in an on state or an off state until the measured standing wave ratio is less than or equal to the threshold; or
when the standing wave ratio is greater than a threshold, the processor controls the second switch circuit to sequentially adjust each second microwave transmission line to be in an on state or an off state until the measured standing wave ratio is less than or equal to the threshold; or
when the standing wave ratio is greater than a threshold, the processor controls the first switch circuit and the second switch circuit to sequentially adjust each first microwave transmission line and each second microwave transmission line to be in an on state or an off state until the measured standing wave ratio is less than or equal to the threshold.

12. The apparatus according to claim 11, wherein the apparatus further comprises:
a controller, for adjusting the equivalent impedance of the impedance tuner to correspond to the load impedance of the transmit coil, so as to achieve impedance matching.

13. The apparatus according to claim 11, wherein the controller controls the first switch circuit to adjust each first microwave transmission line to be in an on state or an off state, so as to achieve impedance matching; or, the controller controls the second switch circuit to adjust each second microwave transmission line to be in an on state or an off state, so as to achieve impedance matching; or, the controller controls the first switch circuit and the second switch circuit to adjust each first microwave transmission line and each second microwave transmission line to be in an on state or an off state, so as to achieve impedance matching.

14. The apparatus according to claim 11, wherein the controller controls at least one of the first switch circuit and the second switch circuit by using a high voltage signal and a current source signal of the transmission apparatus.

15. The apparatus according to claim 11, wherein the number of the impedance tuners is 2 when the transmit coil comprises independent I and Q channels.

16. A magnetic resonance system, wherein the system comprises:
a transmit coil; and
the transmission apparatus according to claim 11.

17. A transmission method of a magnetic resonance system, wherein the method comprises:
generating and outputting a pulse signal by a signal output unit;
amplifying the pulse signal by a radio-frequency power amplifier;
transferring, by the impedance tuner, the signal amplified by the radio-frequency power amplifier to a transmit coil of the magnetic resonance system;
wherein the impedance tuner comprises at least one of: an amplitude tuning circuit and a phase tuning circuit;
wherein the amplitude tuning circuit comprises M serially-connected amplitude tuners; each amplitude tuner comprises at least one first microwave transmission line and a first switch circuit connected in parallel, the first switch circuit being configured to control the at least one first microwave transmission line to be in an on state or an off state, respectively, and the value of M is a positive integer greater than or equal to 1;
wherein the phase tuning circuit comprises a phase tuner, the phase tuner comprising P second microwave transmission lines and a second switch circuit, the second switch circuit being configured to control the P second microwave transmission lines to be in an on state or an off state, respectively, and the value of P is a positive integer greater than or equal to 2;
wherein the method further comprises:
measuring a standing wave ratio by a processor;
when the standing wave ratio is greater than a threshold, controlling the first switch circuit to sequentially adjust each first microwave transmission line to be in an on state or an off state until the measured standing wave ratio is less than or equal to the threshold; or
when the standing wave ratio is greater than a threshold, controlling the second switch circuit to sequentially adjust each second microwave transmission line to be in an on state or an off state until the measured standing wave ratio is less than or equal to the threshold; or
when the standing wave ratio is greater than a threshold, controlling the first switch circuit and the second switch circuit to sequentially adjust each first microwave transmission line and each second microwave transmission line to be in an on state or an off state until the measured standing wave ratio is less than or equal to the threshold.

18. The method according to claim 17, wherein the method further comprises:
adjusting, by a controller, the equivalent impedance of the impedance tuner to correspond to the load impedance of the transmit coil to, so as to achieve impedance matching.

19. An impedance tuner, characterized in that the impedance tuner comprises at least one of: an amplitude tuning circuit and a phase tuning circuit;
the amplitude tuning circuit comprises M serially-connected amplitude tuners; each amplitude tuner comprises at least one first microwave transmission line and a first switch circuit connected in parallel, the first switch circuit being configured to control the at least one first microwave transmission line to be in an on state or an off state, respectively, and the value of M is a positive integer greater than or equal to 1;
the phase tuning circuit comprises a phase tuner, the phase tuner comprising P second microwave transmission lines and a second switch circuit, the second switch circuit being configured to control the P second microwave transmission lines to be in an on state or an off state, respectively, and the value of P is a positive integer greater than or equal to 2;
wherein the impedance tuner further comprises: a controller configured to receive a measurement of a standing wave ratio; when the standing wave ratio is greater than a threshold, the processor controls the second switch circuit to sequentially adjust each second microwave transmission line to be in an on state or an off state until the measured standing wave ratio is less than or equal to the threshold.

20. An impedance tuner, characterized in that the impedance tuner comprises at least one of: an amplitude tuning circuit and a phase tuning circuit;
the amplitude tuning circuit comprises M serially-connected amplitude tuners; each amplitude tuner comprises at least one first microwave transmission line and a first switch circuit connected in parallel, the first switch circuit being configured to control the at least one first microwave transmission line to be in an on state or an off state, respectively, and the value of M is a positive integer greater than or equal to 1;
the phase tuning circuit comprises a phase tuner, the phase tuner comprising P second microwave transmission lines and a second switch circuit, the second switch circuit being configured to control the P second microwave transmission lines to be in an on state or an off state, respectively, and the value of P is a positive integer greater than or equal to 2;
wherein the impedance tuner further comprises: a controller configured to receive a measurement of a standing wave ratio; when the standing wave ratio is greater than a threshold, the processor controls the first switch circuit and the second switch circuit to sequentially adjust each first microwave transmission line and each second microwave transmission line to be in an on state or an off state until the measured standing wave ratio is less than or equal to the threshold.

\* \* \* \* \*